(12) United States Patent
Janssens et al.

(10) Patent No.: US 10,615,217 B2
(45) Date of Patent: Apr. 7, 2020

(54) IMAGE SENSORS WITH VERTICALLY STACKED PHOTODIODES AND VERTICAL TRANSFER GATES

(71) Applicant: SEMICONDUCTOR COMPONENTS INDUSTRIES, LLC, Phoenix, AZ (US)

(72) Inventors: Johan Camiel Julia Janssens, Asse (BE); Manuel H. Innocent, Wezemaal (BE); Sergey Velichko, Boise, ID (US); Tomas Geurts, Haasrode (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/182,766

(22) Filed: Nov. 7, 2018

(65) Prior Publication Data

US 2019/0074317 A1 Mar. 7, 2019

Related U.S. Application Data

(62) Division of application No. 15/480,078, filed on Apr. 5, 2017, now Pat. No. 10,163,963.

(51) Int. Cl.
*H01L 27/146* (2006.01)
*H04N 5/374* (2011.01)
*H04N 5/378* (2011.01)

(52) U.S. Cl.
CPC .... *H01L 27/14643* (2013.01); *H01L 27/1463* (2013.01); *H01L 27/1464* (2013.01);
(Continued)

(58) Field of Classification Search
CPC .......... H01L 27/14643–14663; H01L 27/14645–14647;
(Continued)

(56) References Cited

U.S. PATENT DOCUMENTS 7,768,047 B2    5/2010  Mauritzson et al.
8,531,567 B2    9/2013  Roy et al.
(Continued)

FOREIGN PATENT DOCUMENTS

EP    2133918 A2    12/2009
EP    2216817 A1    8/2010
EP    3270419 A2    1/2018

OTHER PUBLICATIONS

Janssens et al., U.S. Appl. No. 15/480,076, filed Apr. 5, 2017.
(Continued)

*Primary Examiner* — Tucker J Wright
(74) *Attorney, Agent, or Firm* — Treyz Law Group, P.C.; Jason Tsai; Joseph F. Guihan

(57) ABSTRACT

Image sensors may include multiple vertically stacked photodiodes interconnected using vertical deep trench transfer gates. A first n-epitaxial layer may be formed on a residual substrate; a first p-epitaxial layer may be formed on the first n-epitaxial layer; a second n-epitaxial layer may be formed on the first p-epitaxial layer; a second p-epitaxial layer may be formed on the second n-epitaxial layer; and so on. The n-epitaxial layers may serve as accumulation regions for the different epitaxial photodiodes. A separate color filter array is not needed. The vertical transfer gates may be a deep trench that is filled with doped conductive material, lined with gate dielectric liner, and surrounded by a p-doped region. Image sensors formed in this way may be used to support a rolling shutter configuration or a global shutter configuration and can either be front-side illuminated or backside illuminated.

20 Claims, 22 Drawing Sheets

(52) U.S. Cl.
CPC .. *H01L 27/14609* (2013.01); *H01L 27/14614* (2013.01); *H01L 27/14636* (2013.01); *H01L 27/14638* (2013.01); *H01L 27/14647* (2013.01); *H01L 27/14652* (2013.01); *H01L 27/14689* (2013.01); *H04N 5/374* (2013.01); *H04N 5/378* (2013.01)

(58) Field of Classification Search
CPC ....... H01L 27/14649–14652; H01L 27/14689; H01L 21/823406; H01L 27/1057; H01L 29/765–76891; H01L 29/66946–66962
See application file for complete search history.

(56) References Cited

U.S. PATENT DOCUMENTS

| | | |
|---|---|---|
| 2004/0000681 A1 | 1/2004 | Shinohara |
| 2007/0131987 A1 | 6/2007 | Kim |
| 2008/0046063 A1 | 2/2008 | Boatman et al. |
| 2008/0265352 A1 | 10/2008 | Akiyoshi |
| 2011/0057238 A1 | 3/2011 | Merrill et al. |
| 2011/0096208 A1 | 4/2011 | Roy et al. |
| 2011/0181749 A1 | 7/2011 | Yamada |
| 2011/0187911 A1 | 8/2011 | Shinohara |
| 2012/0242875 A1 | 9/2012 | Nakamura |
| 2013/0015513 A1 | 1/2013 | Kido et al. |
| 2014/0306276 A1 | 10/2014 | Yamaguchi |
| 2015/0048427 A1 | 2/2015 | Hu et al. |
| 2015/0048474 A1 | 2/2015 | Ishiwata |
| 2016/0343751 A1 | 11/2016 | Sze et al. |
| 2016/0351604 A1 | 12/2016 | Kalnitsky et al. |
| 2017/0200785 A1 | 7/2017 | Janssens |

OTHER PUBLICATIONS

Non-Final Office Action dated Dec. 15, 2017, in U.S. Appl. No. 15/480,076, filed Apr. 5, 2017.

Final Office Action dated May 2, 2018, in U.S. Appl. No. 15/480,076, filed Apr. 5, 2017.

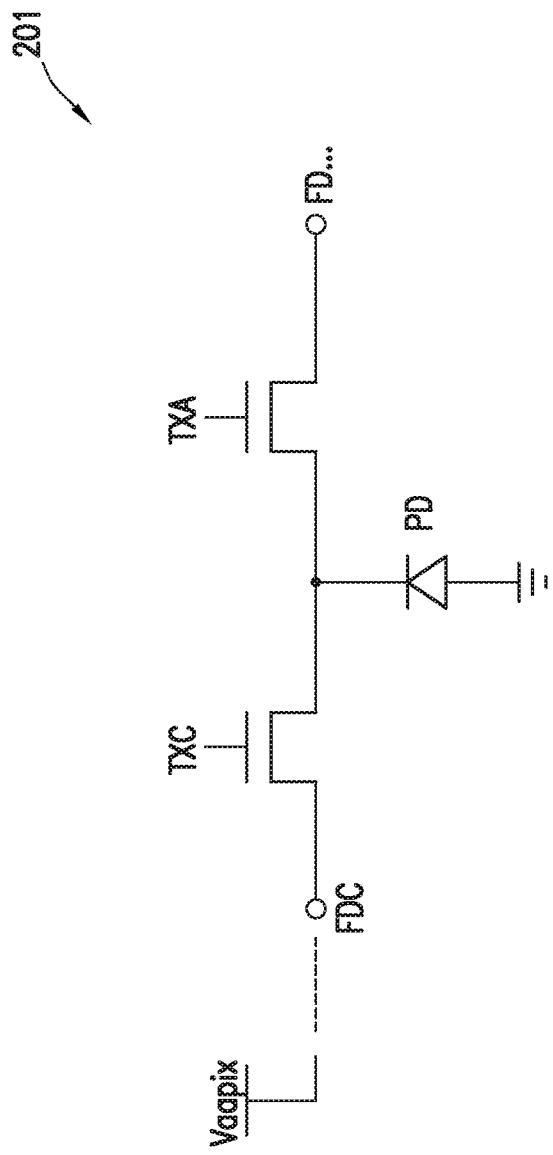

IMAGE SENSORS WITH VERTICALLY STACKED PHOTODIODES AND VERTICAL TRANSFER GATES

This application is a division of U.S. patent application Ser. No. 15/480,078, filed Apr. 5, 2017, which is hereby incorporated by reference herein in its entirety. This application claims the benefit of and claims priority to U.S. patent application Ser. No. 15/480,078, filed Apr. 5, 2017.

BACKGROUND

This relates generally to imaging devices, and more particularly, to imaging devices with vertically stacked photodiodes controlled using vertical transfer gates.

Image sensors are commonly used in electronic devices such as cellular telephones, cameras, and computers to capture images. In a typical arrangement, an electronic device is provided with an array of image pixels arranged in pixel rows and pixel columns.

Conventional image sensors include photodiodes formed using dopant implantation. In some arrangements, stacked photodiodes are formed by implanting n-type regions at different depths in a p-type substrate. A blue photodiode is formed at a first depth in the substrate; a green photodiode is formed at a second depth in the substrate that is greater than the first depth; and a red photodiode is formed at a third depth in the substrate that is greater than the second depth. Moreover, the blue photodiode is formed within a first region on the substrate; the green photodiode is formed within a second region on the substrate that is non-overlapping with the first region; and the red photodiode is formed within a third region on the substrate is non-overlapping with the first and second regions. Each of these regions is connected to a top node through respective large photodiode trunk structures.

While vertically stacked photodiodes formed in this way might be capable of resolving red, green, and blue colors without color filter arrays, these photodiodes exhibit undesired optical and electrical crosstalk due to the large trunk structures. It is also difficult to precisely control the depth and dopant profiles of the different stacked photodiodes and their trunk structures. Furthermore, this configuration is not scalable to smaller dimensions since many trunk structures and gates are needed.

DETAILED DESCRIPTION

Embodiments of the present invention relate to image sensor pixels with a multi-layer photodiode structure that may be constructed using p-type and n-type epitaxial layers and/or some combination of epitaxial layers and/or p-type and n-type implants. A vertical charge transfer gate and adjacent n-type layers may collectively form stacked photodiodes. The vertical charge transfer gate may be used to convey charge from one of the stacked photodiodes to another. In general, each image pixel may include at least one epitaxial layer, at least two vertically stacked photodiodes, at least three vertically stacked photodiodes, or four or more vertically stacked photodiodes (e.g., photodiodes formed using epitaxial layers or deep/shallow implant regions) that are operable in either an electronic rolling shutter scheme or a global shutter scheme.

Figure 1:
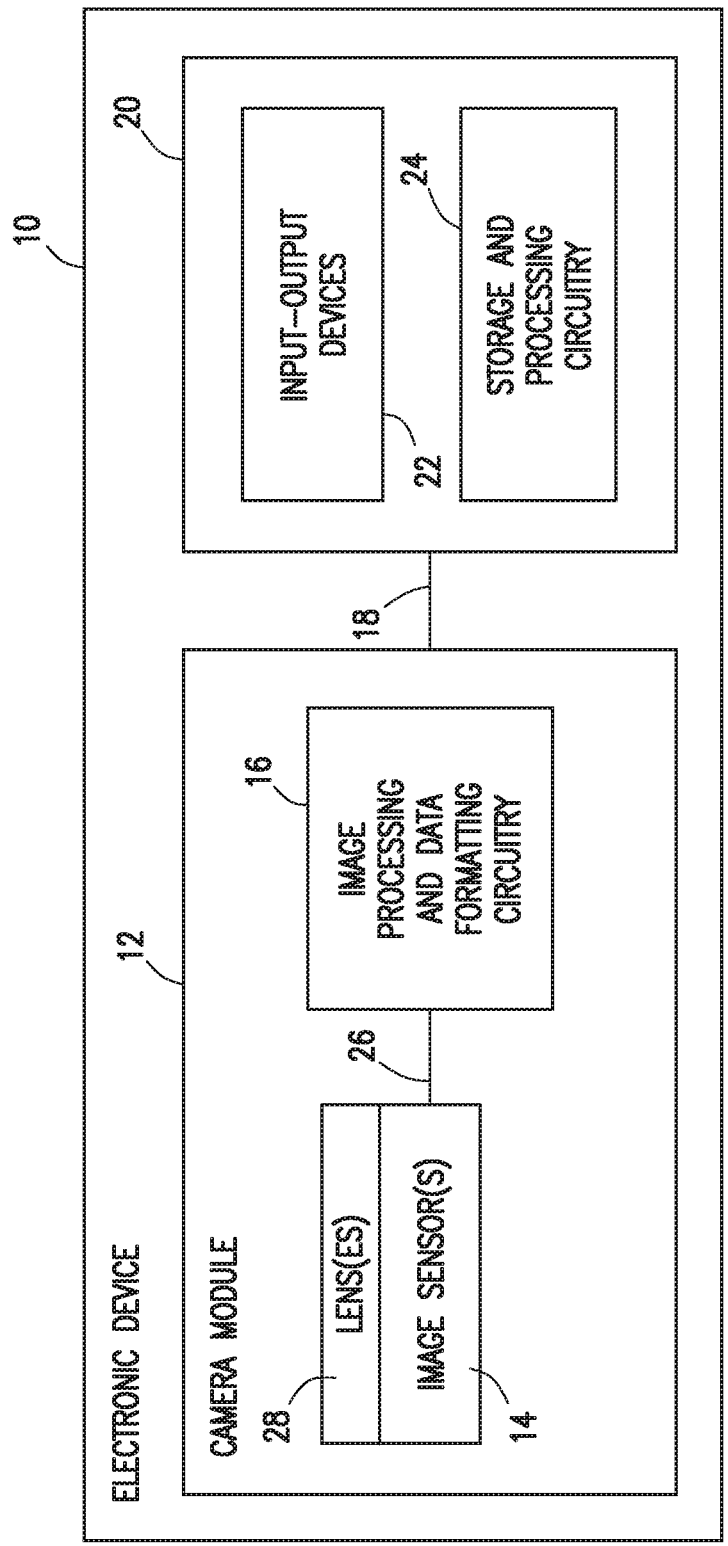
FIG. 1 is a schematic diagram of an illustrative electronic device with an image sensor that may include epitaxial photodiodes and vertical (deep trench isolation) transfer gates in accordance with an embodiment.

An electronic device with a camera module is shown in FIG. 1. Electronic device 10 (sometimes referred to as an imaging system) may be a digital camera, a computer, a cellular telephone, a medical device, or other electronic device. Camera module 12 (sometimes referred to as an imaging device) may include one or more image sensors 14 and one or more lenses 28. During operation, lenses 28 (sometimes referred to as optics 28) focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16. Image processing and data formatting circuitry 16 may be used to perform image processing functions such as automatic focusing functions, depth sensing, data formatting, adjusting white balance and exposure, implementing video image stabilization, face detection, etc. For example, during automatic focusing operations, image processing and data formatting circuitry 16 may process data gathered by three-dimensional imaging pixels in image sensor 14 to determine the magnitude and direction of lens movement (e.g., movement of lens 28) needed to bring an object of interest into focus.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits. For example, camera sensor 14 and image processing and data formatting circuitry 16 may be formed using separate integrated circuits that have been stacked.

Camera module 12 may convey acquired image data to host subsystems 20 over path 18 (e.g., image processing and data formatting circuitry 16 may convey image data to subsystems 20). Electronic device 10 (sometimes referred to as a system or imaging system) typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Input-output devices 22 may also include light sources such as light-emitting diodes that may be used in combination with image sensor(s) 14 to obtain time-of-flight depth sensing information. Input-output devices 22 may include, for example, a light source that emits visible or infrared light.

Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

Figure 2A:
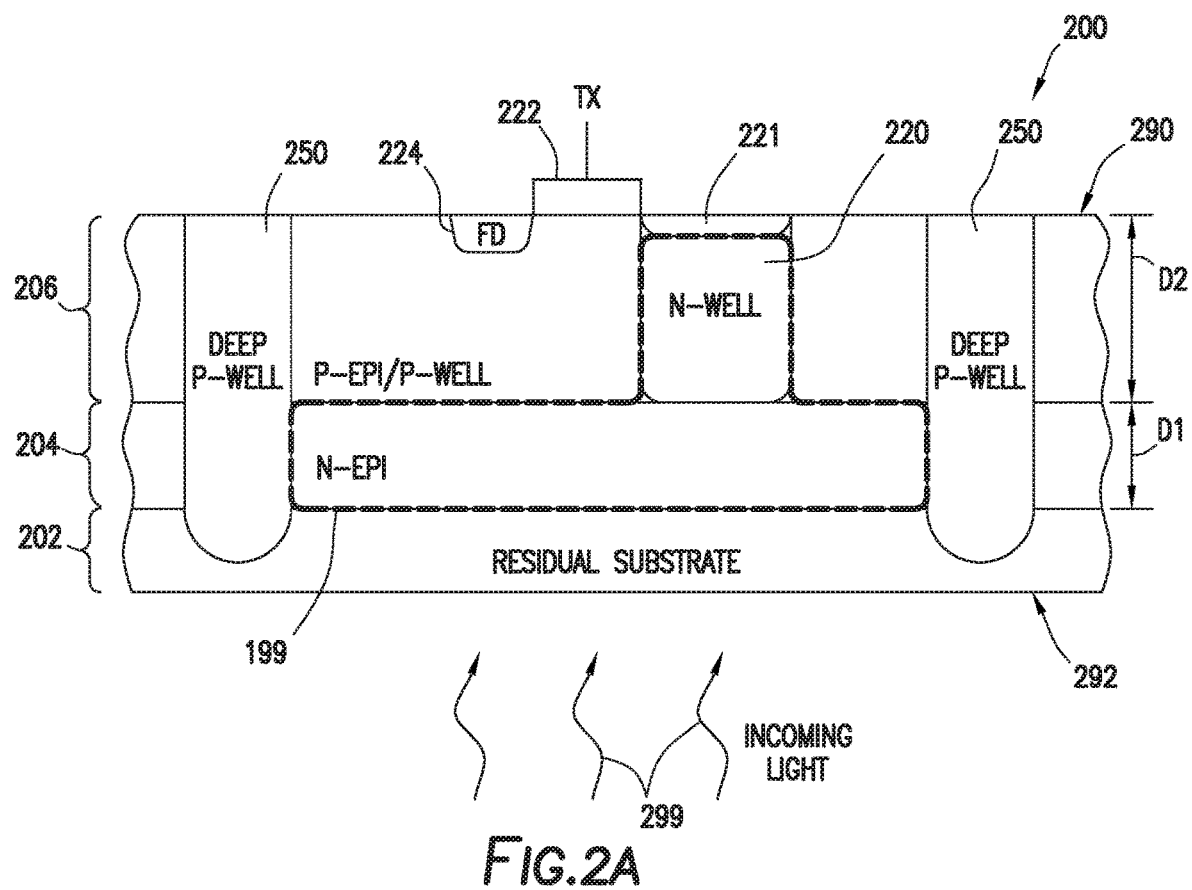
FIGS. 2A-2D are diagrams showing one or more vertically stacked epitaxial photodiodes that are separated using isolation structures in accordance with at least some embodiments.

FIG. 2A is a cross-sectional side view of an image sensor such as sensor 200 formed from at least one epitaxial layer. As shown in FIG. 2A, sensor 200 may include a residual substrate 202 (e.g., a p-type or n-type substrate for providing a clean crystalline layer for subsequent epitaxial growth), an n-type epitaxial ("n-epi") layer 204 grown on residual substrate 202, and a p-type epitaxial ("p-epi") layer 206 grown on n-epi layer 204. Optionally, layer 206 may also be a layer in which a p-well is formed. The epitaxial layer(s) can be formed via vapor-phase epitaxy, liquid-phase epitaxy, solid-phase epitaxy, or other types of chemical deposition. Epitaxial layers may be doped either n-type or p-type during chemical vapor deposition (as an example) by adding impurities to the source gas.

An n-type region such as n-well 220 may be formed in layer 206 and may be coupled to n-epi layer 204. If desired, an optional shielding region such as shallow p-type implant region 221 may be formed at the surface of layer 206 directly above n-well 220. A charge transfer gate 222 (controlled by signal TX) may be coupled between n-well 220 and floating diffusion (FD) region 224. Additional front-side pixel structures such as reset gates, source follower transistors, and row-select transistors are not shown so as not to unnecessarily obscure the present embodiment.

A deep p-well region such as region 250 may extend from the front surface 290 (i.e., the upper surface of layer 206 as shown in the orientation of FIG. 2A) all the way down to residual substrate 202. Deep p-well region 250 may serve as pixel isolation structures for delineating the boundary between adjacent imaging pixels and can help reduce electrical crosstalk. Configured in this way, the n-type regions such the portion of layer 204 and n-well 220 marked within dotted region 199 and surrounding p-type regions 250, 206, and 202 may serve as a deep epitaxial photodiode.

As shown in the example of FIG. 2A, incoming light 299 may enter from the back side 292 of the image sensor. This type of imaging configuration is referred to as backside illumination (BSI). If desired, deep epitaxial photodiodes may also be used to support front side illumination (FSI), where light enters from front side 290 of the sensor.

Figure 2B:
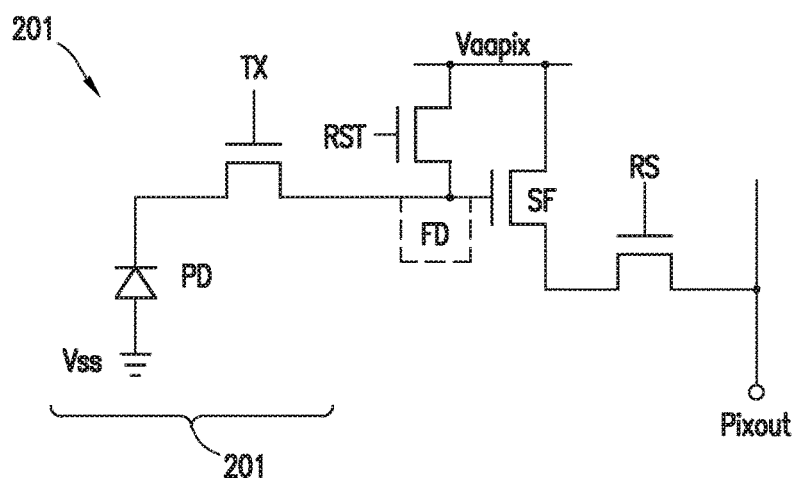

FIG. 2B is an exemplary circuit diagram of a pixel 201. As shown in FIG. 2B, pixel 201 may have a deep epitaxial photodiode PD that is coupled to the floating diffusion node via a charge transfer transistor, a reset transistor (controlled by signal RST) coupled between power supply line Vaapix and the floating diffusion node, a source follower transistor SF having a drain terminal coupled to power supply line Vaapix, a gate terminal shorted to the floating diffusion node, and a source terminal that is coupled to pixel output line Pixout via a row select transistor (controlled by signal RS). The p-type terminal of photodiode PD may be shorted to ground power supply line Vss (usually via p-type structures). This pixel circuit implementation is merely illustrative. In general, pixel 201 may include any number of photodiodes and/or storage diodes, any number of charge transfer gates and storage gates, and any number of associated readout/control circuitry.

Figure 2C:
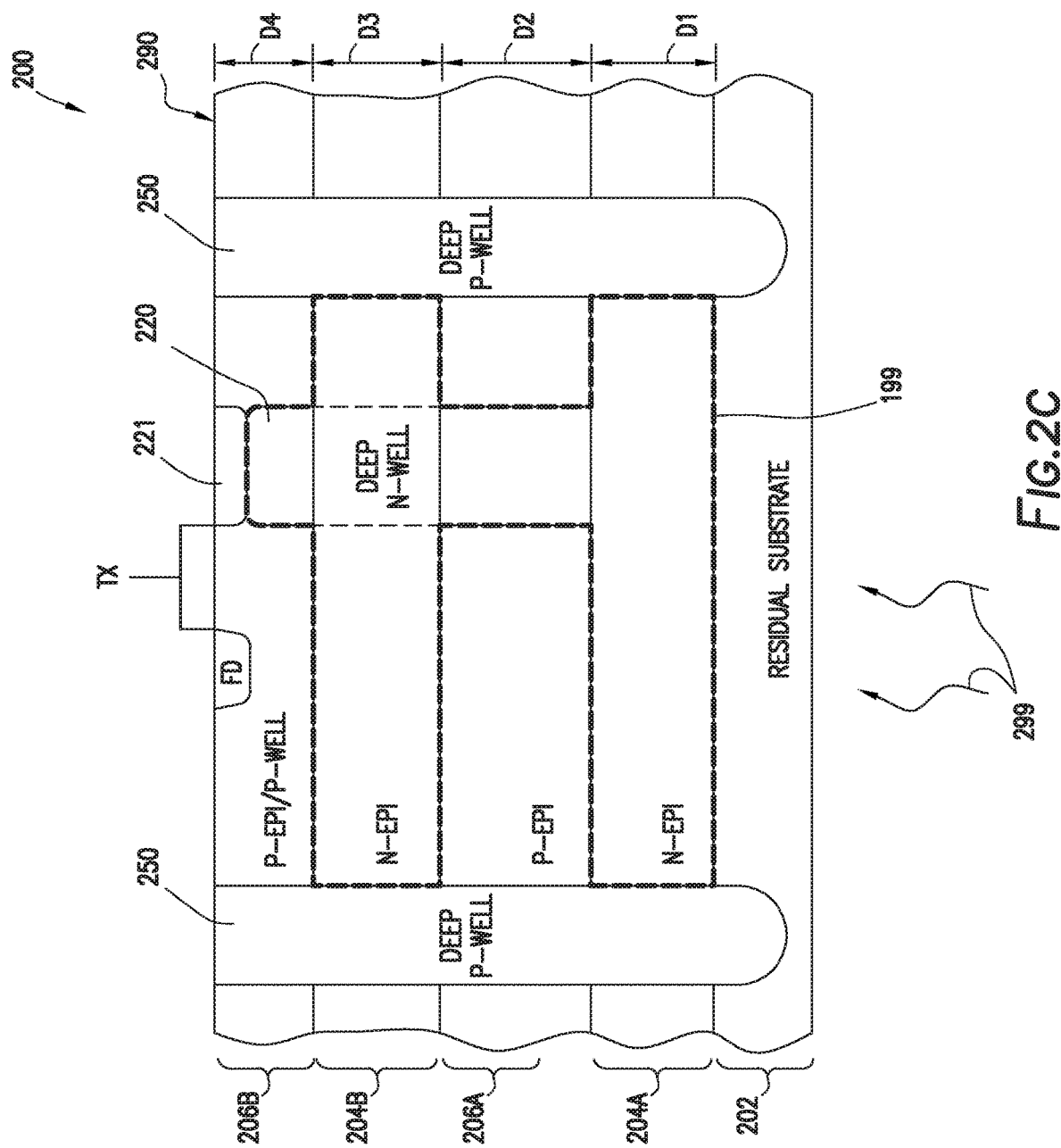

FIG. 2C shows another suitable arrangement in which sensor 200 may include at least two vertically stacked photodiodes. As shown in FIG. 2C, sensor may include a first n-epi layer 204A grown on residual substrate 202, a first p-epi layer 206A grown on n-epi layer 204A, a second n-epi layer 204B grown on p-epi layer 206A, and a second p-epi layer 206B grown on n-epi layer 204B. Optionally, layer 206B may also be a layer in which a p-well is formed.

An n-type region such as a deep n-well 220 may extend from the front surface of the sensor down to layer 204A and may therefore be coupled to n-epi layers 204A and 204B. If desired, an optional shielding region such as shallow p-type implant region 221 may be formed at the surface of layer 206 directly above n-well 220.

Deep p-well region such as region 250 may extend from front surface 290 all the way down to residual substrate 202. Deep p-well region 250 may serve as pixel isolation structures for delineating the boundary between adjacent imaging pixels and can help reduce electrical crosstalk. Configured in this way, the n-type regions such the portion of layers 204A and 204B and n-well 220 marked within dotted region 199 and surrounding p-type regions 250, 206A, 206B, and 202 may serve as a multi-layer epitaxial photodiode.

In the example of FIG. 2C, layers 204A, 206A, 204B, and 206B may have thicknesses D1, D2, D3, and D4, respectively. For example, thickness D4 may be several microns to reduce the light sensitivity of the structures at the front side in a global shutter configuration. In general, the thicknesses of the epitaxial layers can be adjusted to optimize the responsivity and/or the color selectivity of the photodiodes. The dopant and thicknesses of the epitaxial layers can be independently tailored to make the photodiodes deplete fully at the desired voltage of choice, especially at large depths. For example, deep n-epi layer 204A can be thin (i.e., D1 might be smaller than D2 or D3), which is generally not possible through implant. The dopant (grading) profile of each epitaxial layer can also be precisely controlled during epitaxial growth to create a weak electrical field that would pull photon generated charge into corresponding photodiodes. The embodiment of FIG. 2C may also support BSI, as indicated by the direction of incoming light 299 from the back side of sensor 200.

Figure 2D:
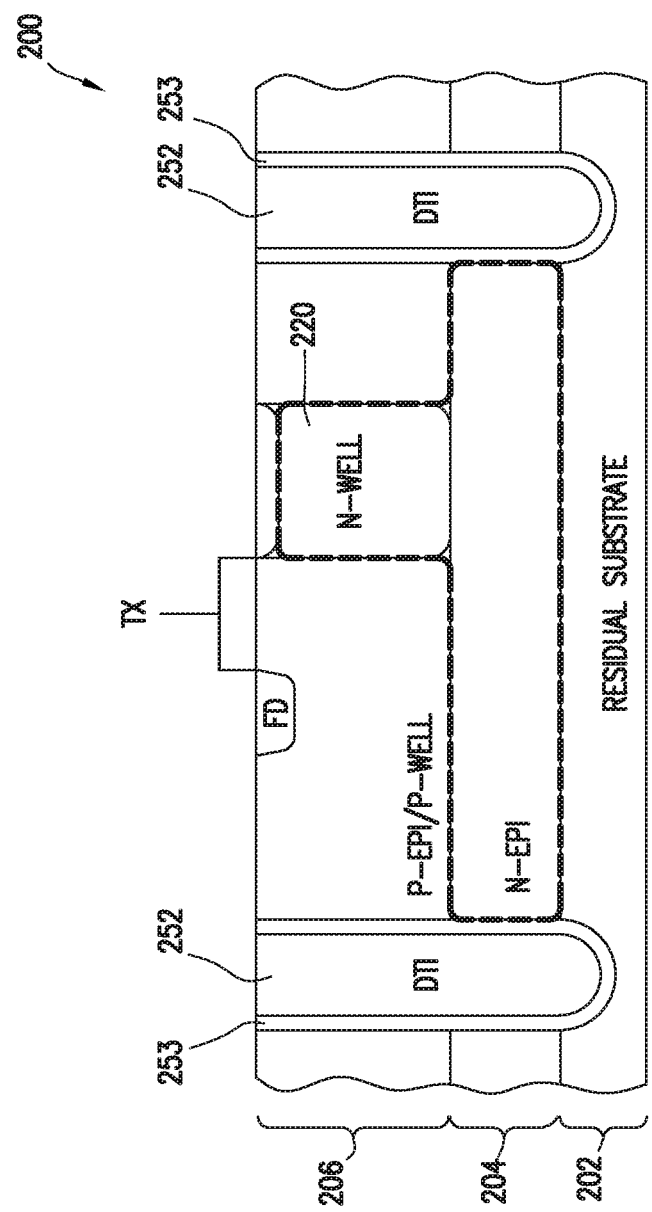

FIG. 2D shows yet another suitable arrangement in which image sensor 200 of FIG. 2A includes deep trench isolation (DTI) structures such as DTI structures 252 surrounding each pixel. Similar to deep p-well regions 250, DTI structures 252 may extend from the front surface all the way down to residual substrate 202 and can help reduce electrical and also optical crosstalk. A p-type layer such as layer 253 may surround the DTI structures 252 to ensure that the n-epi portion of the photodiode is completely surrounded by a p-type region. If desired, the embodiment of FIG. 2C may also be formed using DTI structures 252 lined with p-type layer 253 instead of deep p-well 250. In general, DTI structure surrounded with either a p-type or n-type liner may be used as isolation structures for any type of photodiode.

Figure 3A:
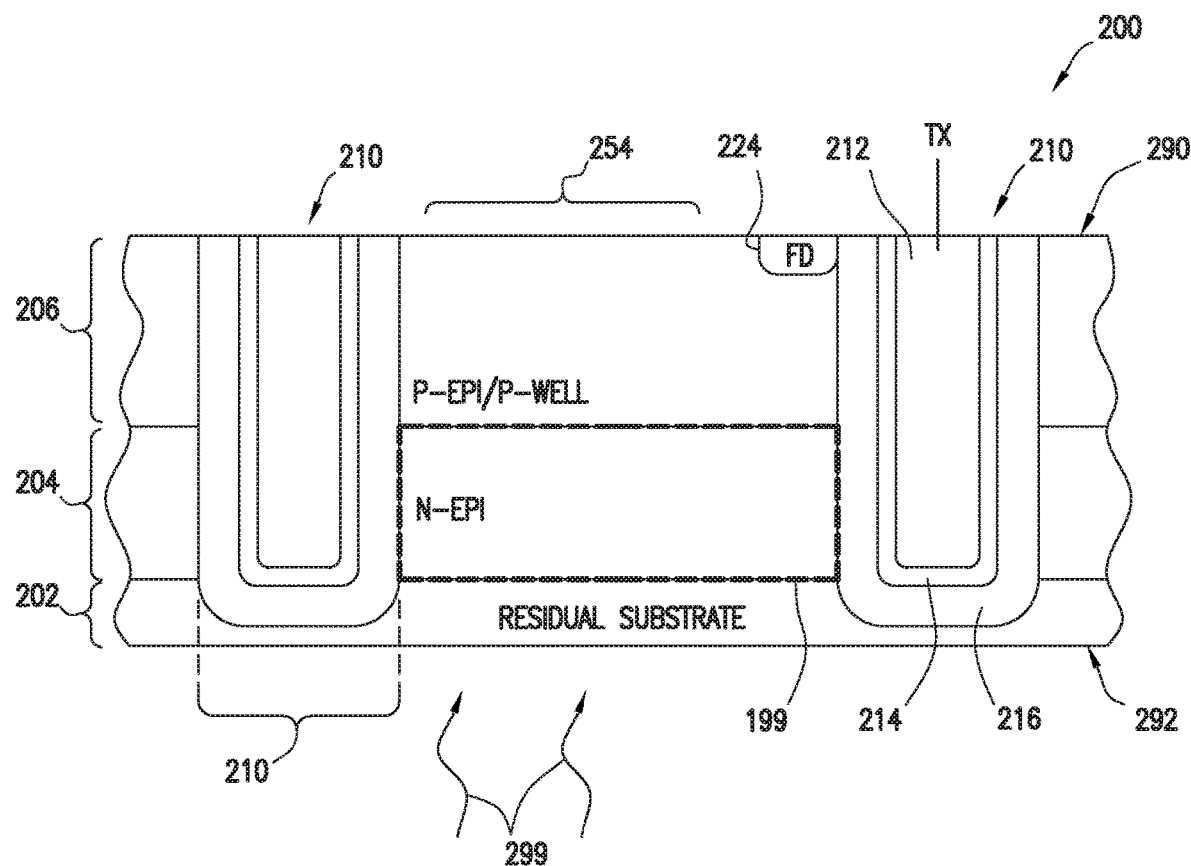
FIGS. 3A-3O are diagrams showing one or more vertically stacked epitaxial photodiodes that are coupled to vertical transfer gate structures in accordance with at least some embodiments.

FIG. 3A is a cross-sectional side view of an image sensor such as sensor 200 formed from at least one epitaxial layer and vertical charge transfer gate structures. As shown in FIG. 3A, sensor 200 may include a residual substrate 202 (e.g., a p-type or n-type substrate for providing a clean crystalline layer for subsequent epitaxial growth), n-epi layer 204 grown on residual substrate 202, and p-epi layer 206 grown on n-epi layer 204. Optionally, layer 206 may also be a layer in which a p-well is formed. The epitaxial layer(s) can be formed via vapor-phase epitaxy, liquid-phase epitaxy, solid-phase epitaxy, or other types of chemical deposition. Epitaxial layers may be doped either n-type or p-type during chemical vapor deposition (as an example) by adding impurities to the source gas.

A floating diffusion (FD) region such as n-type region 224 may be formed at the upper (front) surface of layer 206. Additional front-side pixel structures such as reset gates, source follower transistors, and row-select transistors are not shown so as not to unnecessarily obscure the present embodiment.

A deep trench structure such as structure 210 may extend from front surface 290 all the way down to residual substrate 202. Structure 210 may be a trench that includes conductive gate material 212 (e.g., polysilicon, tungsten, or other suitable gate metal), dielectric liner 214 (e.g., a gate oxide liner), and a p-doped region 216 surrounding the trench. Configured in this way, the portion of layer 204 marked within dotted region 199 and surrounding p-type regions 216, 206, and 202 may serve as a photodiode (e.g., an epitaxial photodiode or an epitaxial-layer-based photodiode).

Structure 210 may serve to delimit the border of each photodiode and may also serve as a vertical transfer gate structure for transferring accumulated charge from region 199 to floating diffusion region 224 by asserting charge transfer signal TX (e.g., vertical transfer gate 210 may be in contact with or is coupled to both n-epi region 199 and floating diffusion region FD). P-type layer 216 formed at the edges of the trench can help shield the photodiode from being directly exposed to a damaged interface and can also help reduce crosstalk.

As shown in the example of FIG. 3A, incoming light 299 may enter from the back side 292 of the image sensor. This type of imaging configuration is referred to as backside illumination (BSI). If desired, the photodiode configuration of FIG. 3A may also be used to support front side illumination (FSI), where light enters from front side 290 of sensor 200.

Figure 3B:
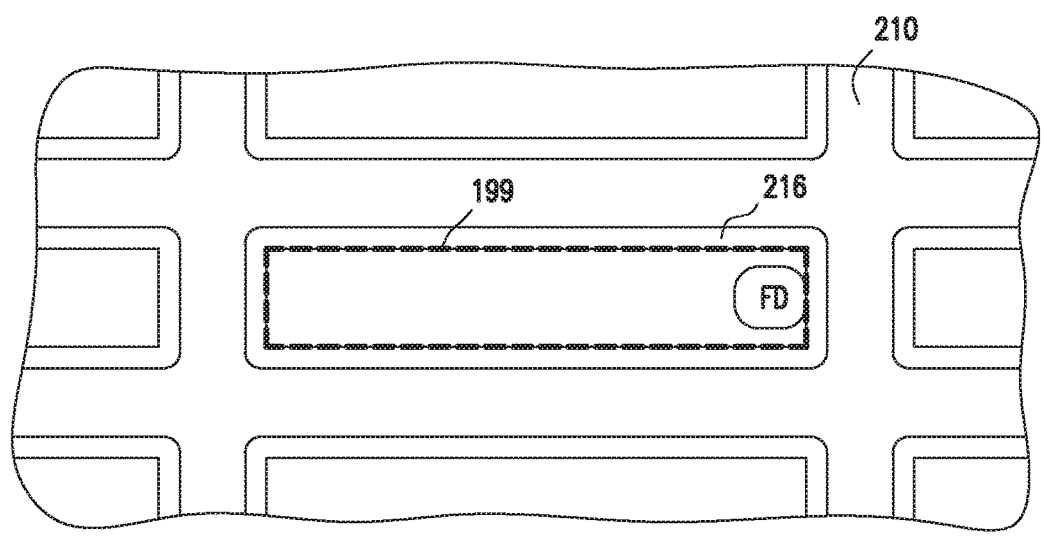

FIG. 3B is a top view of the sensor shown in FIG. 3A. As shown in FIG. 3B, the photodiode region 199 may have an elongated rectangular shape that is surrounded by vertical transfer gate structure 210, which is formed as a grid. In other words, vertical transfer gate 210 may be configured as a matrix or mesh of trench structures that form an array of slots in which respective photodiodes are formed. The floating diffusion region has a smaller footprint than photodiode region 199 and may be formed directly above region 199. The rectangular footprint of photodiode region 199 is merely illustrative. If desired, vertical transfer gate structures 210 may be configured in any suitable way such that photodiode region 199 can have any one of the following shapes: square, diamond, parallelogram, triangle, rectangle, pentagon, hexagon, octagon, or other concave/convex regular or irregular polygon.

Figure 3C:
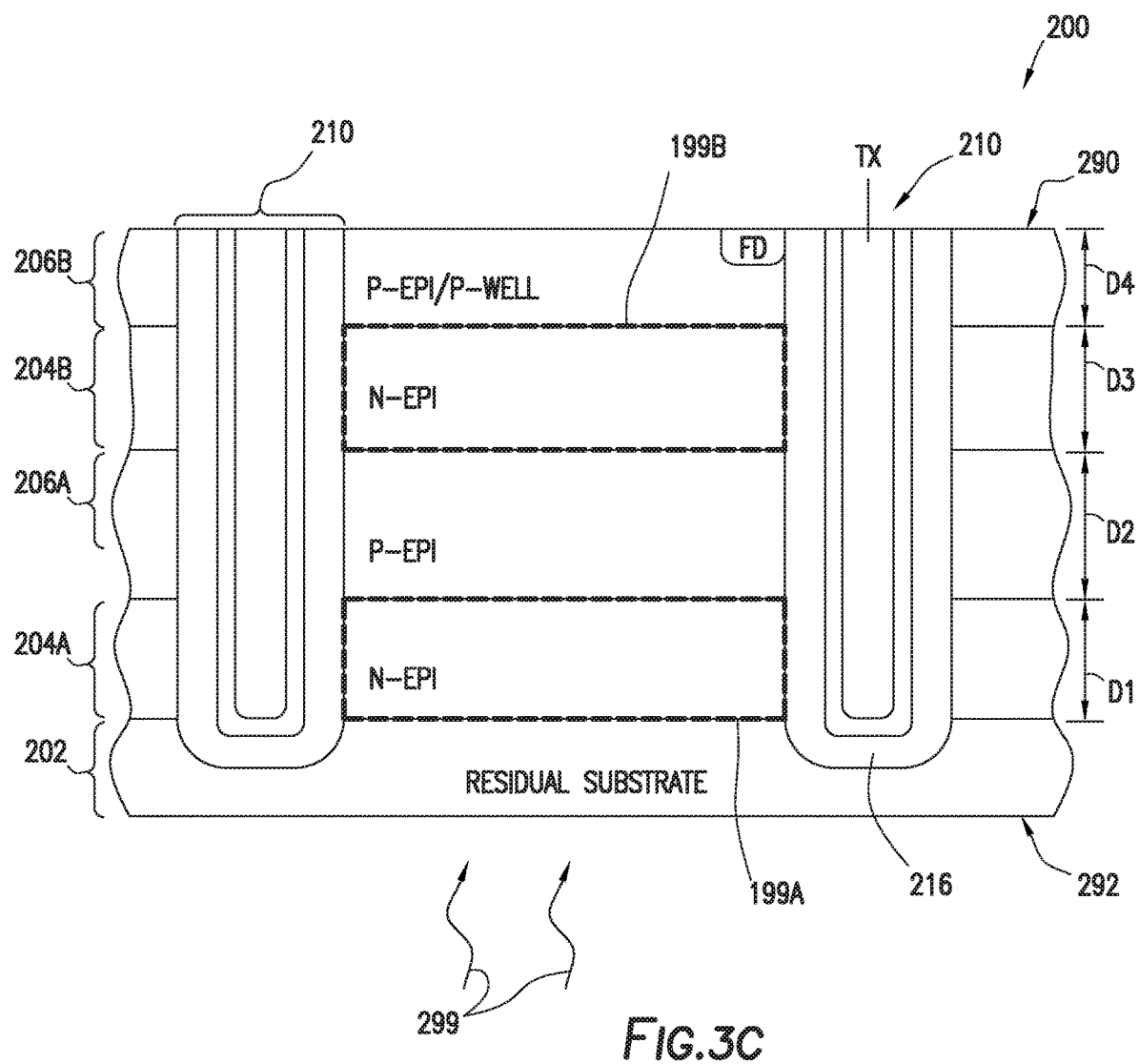

FIG. 3C shows another suitable arrangement in which sensor 200 of FIG. 3A may be extended to include at least two vertically stacked photodiodes (e.g., at least two separate n-type epitaxial layers). As shown in FIG. 3C, sensor 200 may include a first n-epi layer 204A grown on residual substrate 202, a first p-epi layer 206A grown on n-epi layer 204A, a second n-epi layer 204B grown on p-epi layer 206A, and a second p-epi layer 206B grown on n-epi layer 204B. Optionally, layer 206B may also be a layer in which a p-well is formed.

Vertical transfer gate structures 210 may extend from front surface 290 all the way down to residual substrate 202. In this particular example, since vertical transfer gate 210 touches, contacts, or is coupled to both photodiode regions 199A, 199B, and the floating diffusion (FD) region, accumulated charge may be transferred from both regions 199A and 199B in parallel to region FD if controlled signal TX is asserted. Configured in this way, the n-type regions such the portion of layers 204A and 204B marked within dotted regions 199A and 199B, respectively, and surrounding p-type regions 216, 206A, 206B, and 202 may serve as a multi-layer epitaxial photodiode.

In the example of FIG. 3C, layers 204A, 206A, 204B, and 206B may have thicknesses D1, D2, D3, and D4, respectively. For example, thickness D4 may be several microns to reduce the light sensitivity of the structures at the front side in a global shutter configuration. In general, the thicknesses of the epitaxial layers can be adjusted to optimize the responsivity and/or the color selectivity of the photodiodes. The dopant and thicknesses of the epitaxial layers can be independently tailored to make the photodiodes deplete fully at the desired voltage of choice, especially at large depths. For example, deep n-epi layer 204A can be thin (i.e., D1 might be smaller than D2 or D3), which is generally not possible through implant. The dopant (grading) profile of each epitaxial layer can also be precisely controlled during epitaxial growth to create a weak electrical field that would pull photon generated charge into corresponding photodiodes. The embodiment of FIG. 3C may also support backside illumination (BSI), as indicated by the direction of incoming light 299 from the back side of sensor 200.

The example of FIG. 3C in which sensor 200 includes two separate n-epi layers 204A and 204B is merely illustrative and does not serve to limit the scope of the present embodiments. If desired, sensor 200 may include at least three separate n-epi layers separated by two or more p-epi layers, at least four separate n-epi layers separated by three or more p-epi layers, at least five separate n-epi layers separated by four or more p-epi layers, etc.

Figure 3D:
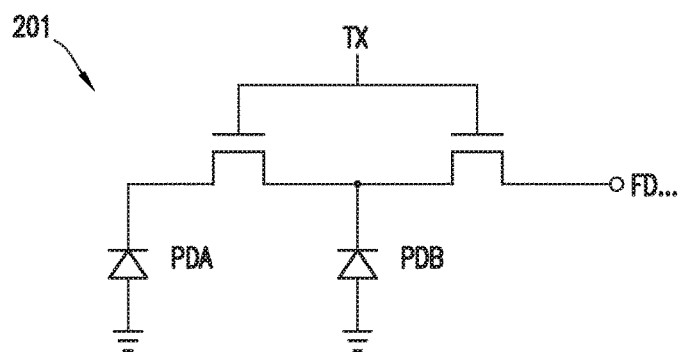

FIG. 3D is an exemplary circuit diagram of pixel 201 formed at least partially using the photodiode configuration of FIG. 3C. As shown in FIG. 3D, pixel 201 may have a first photodiode PDA (corresponding to region 199A of FIG. 3C) and a second photodiode PDB (corresponding to region 199B of FIG. 3C) that can simultaneously transfer charge to the floating diffusion node in response to activating the vertical charge transfer gate structures (e.g., by driving control signal TX high). Various pixel readout transistors (e.g., reset transistors, source follower transistors, row select transistors, etc.) may be coupled to the floating diffusion node but are not shown in FIG. 3D to prevent unnecessarily obscuring the present embodiments.

Figure 3E:
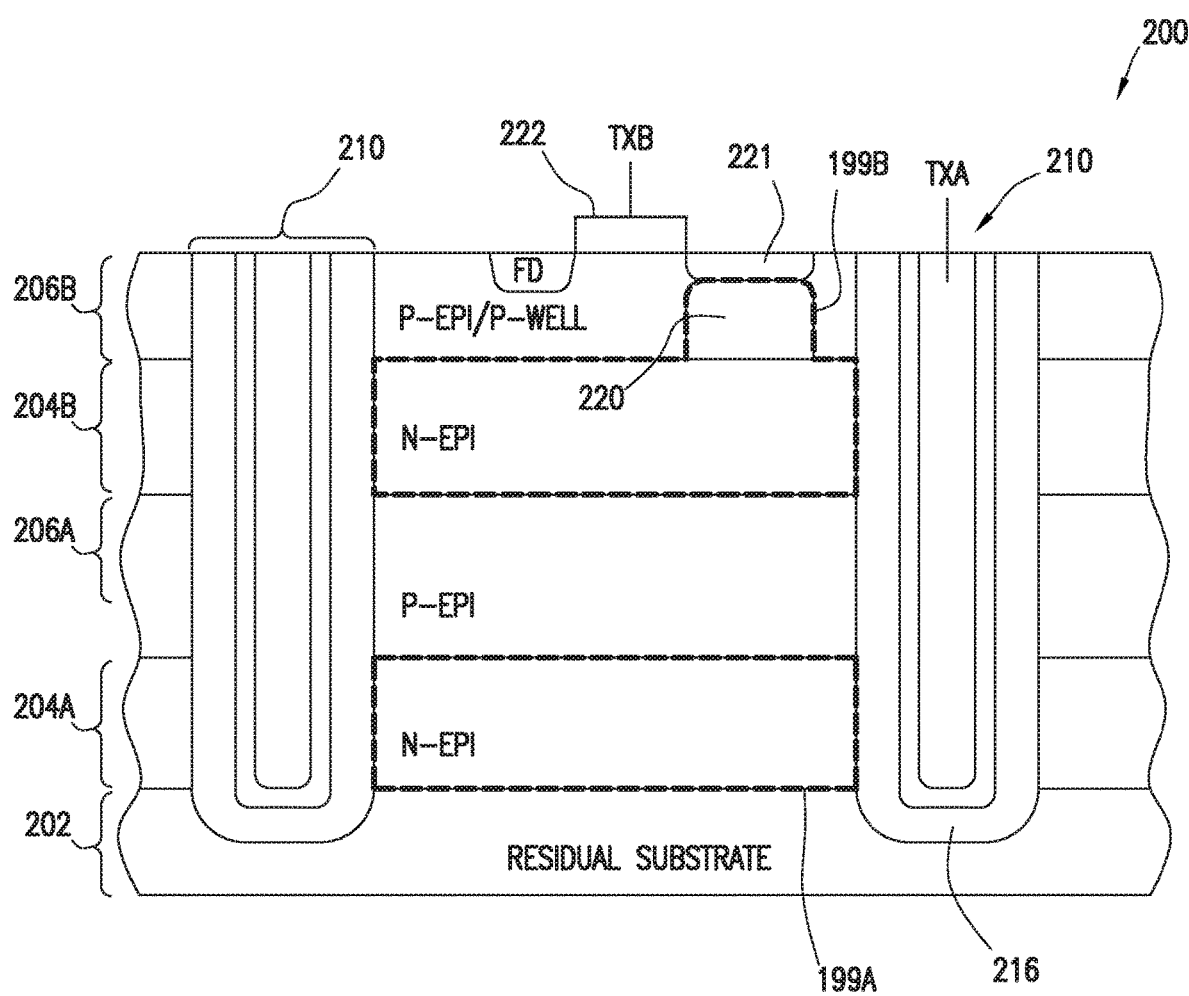

FIG. 3E shows another example that is a variation of the multi-layered photodiode configuration of FIG. 3C. As shown in FIG. 3E, vertical charge transfer gate 210 may be directly in contact with photodiode region 199A and 199B but not floating diffusion region FD. An n-type region such as n-well 220 may be formed in layer 206B and may be coupled to n-epi layer 204B. If desired, an optional shielding region such as shallow p-type implant region 221 may be formed at the surface of layer 206B directly above n-well 220. A charge transfer gate 222 (controlled by signal TXB) may be coupled between n-well 220 and floating diffusion region FD. Charge transfer gate 222 that transfers charge to the floating diffusion region along the front surface and is sometimes referred to as a "horizontal" transfer gate. Additional front-side pixel structures such as reset gates, source follower transistors, and row-select transistors are not shown so as to unnecessarily obscure the present embodiment.

Configured in this way, the n-type regions such the portion of layer 204A marked within dotted region 199A and surrounding p-type regions 216, 206A, and 202 may serve as a first photodiode. Similarly, the portion of layer 204B and n-well 220 marked within dotted region 199B and surrounding p-type regions 216, 206A, 206B, and 221 may serve as a second photodiode. The second photodiode may sometimes be used to serve as a storage diode or a memory node for an image sensor that is operated in a global shutter configuration (as an example).

Figure 3F:
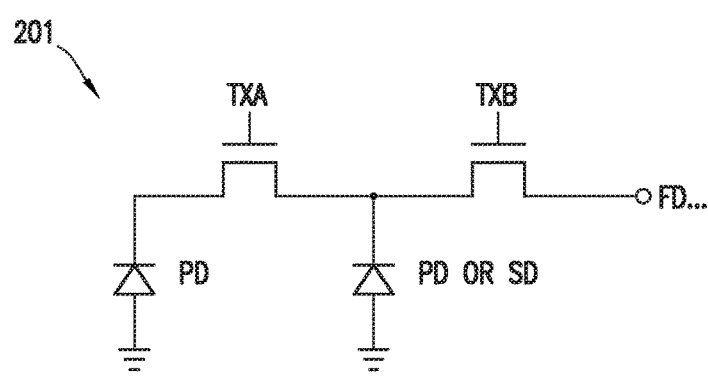

FIG. 3F is an exemplary circuit diagram of pixel 201 formed at least partially using the photodiode configuration of FIG. 3E. As shown in FIG. 3F, pixel 201 may have a first photodiode (corresponding to region 199A of FIG. 3E) and a second photodiode (corresponding to region 199B of FIG. 3E). A vertical transfer gate (controlled by signal TXA) may be coupled between the first photodiode and the second photodiode. A separate horizontal transfer gate (controlled by signal TXB) may be coupled between the second photodiode and the floating diffusion node. Various pixel readout transistors (e.g., reset transistors, source follower transistors, row select transistors, etc.) may be coupled to the floating diffusion node but are not shown in FIG. 3F to prevent unnecessarily obscuring the present embodiments.

Figure 3G:
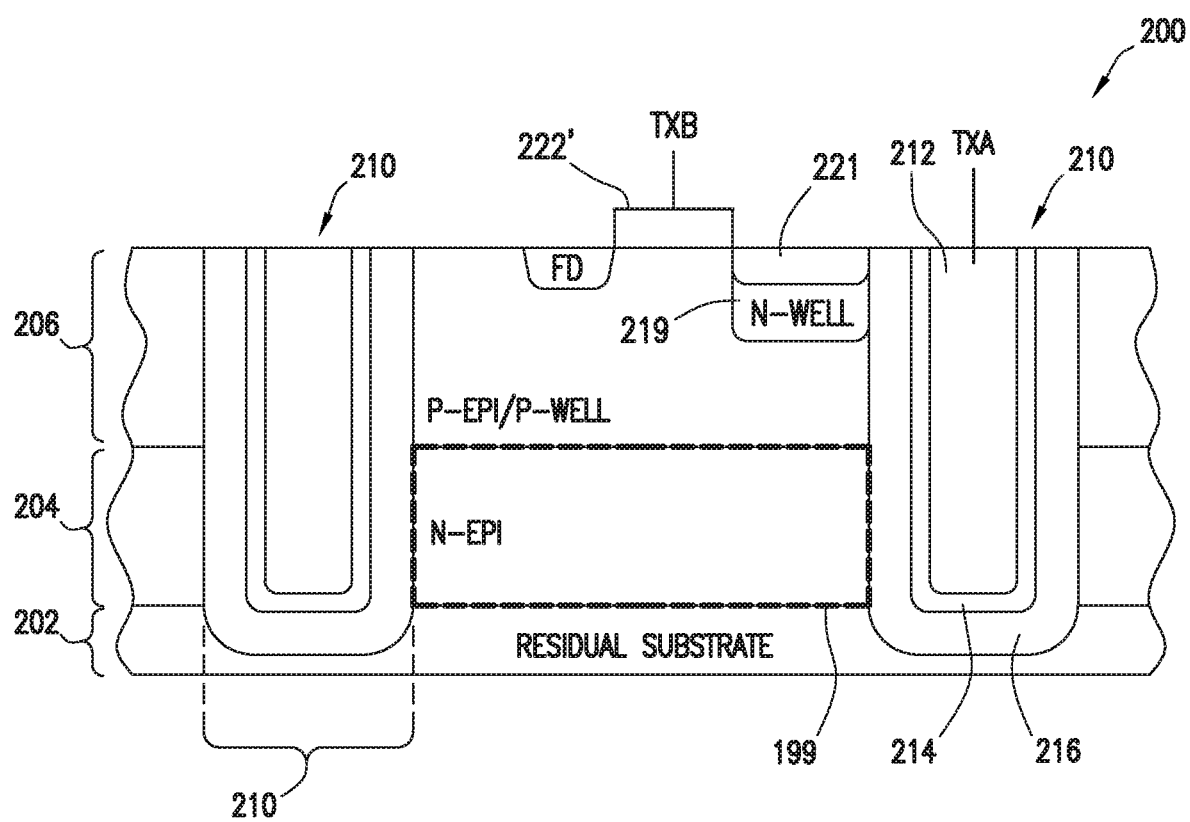

FIG. 3G shows another example that is a variation of the photodiode configuration of FIG. 3A. As shown in FIG. 3G, vertical charge transfer gate 210 may be in contact with or coupled to photodiode region 199 but not floating diffusion region FD. Vertical transfer gate 210 may also directly contact n-well region 219, which can serve as a storage diode or a memory node. If desired, an optional shielding region such as shallow p-type implant region 221 may be formed at the surface of layer 206 directly above n-well 219. A charge transfer gate 222' (controlled by signal TXB) may be coupled between n-well 219 and floating diffusion region FD. Additional front-side pixel structures such as reset gates, source follower transistors, and row-select transistors are not shown so as not to unnecessarily obscure the present embodiment.

Configured in this way, the portion of layer 204 marked within dotted region 199 and surrounding p-type regions 216, 206, and 202 may serve as a deep epitaxial photodiode. Vertical transfer gate 210 may be configured to transfer charge from photodiode region 199 to n-well region 219 (e.g., be selectively asserting control signal TXA). This example in which vertical transfer gate 210 conveys charge from a single epitaxial region 199 to storage diode region 219 is merely illustrative. If desired, this configuration may be extended to support two or more separate n-epi layers (see, e.g., the embodiments of FIGS. 3C and 3E).

Figure 3H:
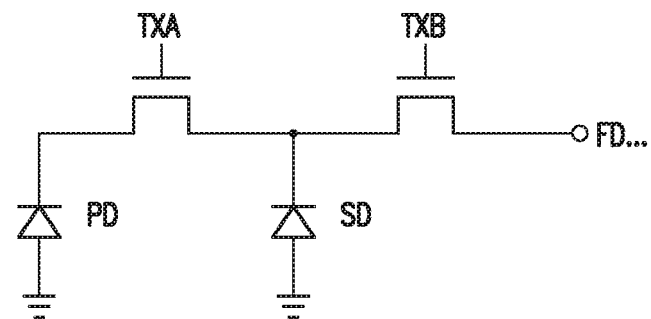

FIG. 3H is an exemplary circuit diagram of pixel 201 formed at least partially using the photodiode configuration of FIG. 3G. As shown in FIG. 3H, pixel 201 may include a photodiode (corresponding to region 199 of FIG. 3G) and a storage/memory diode (corresponding to n-well region 219 of FIG. 3G). A vertical transfer gate (controlled by signal TXA) may be coupled between the photodiode and the storage diode. A separate horizontal transfer gate (controlled by signal TXB) may be coupled between the storage diode and the floating diffusion node. Various pixel readout transistors (e.g., reset transistors, source follower transistors, row select transistors, etc.) may be coupled to the floating diffusion node but are not shown in FIG. 3H to prevent unnecessarily obscuring the present embodiments.

Figure 3I:
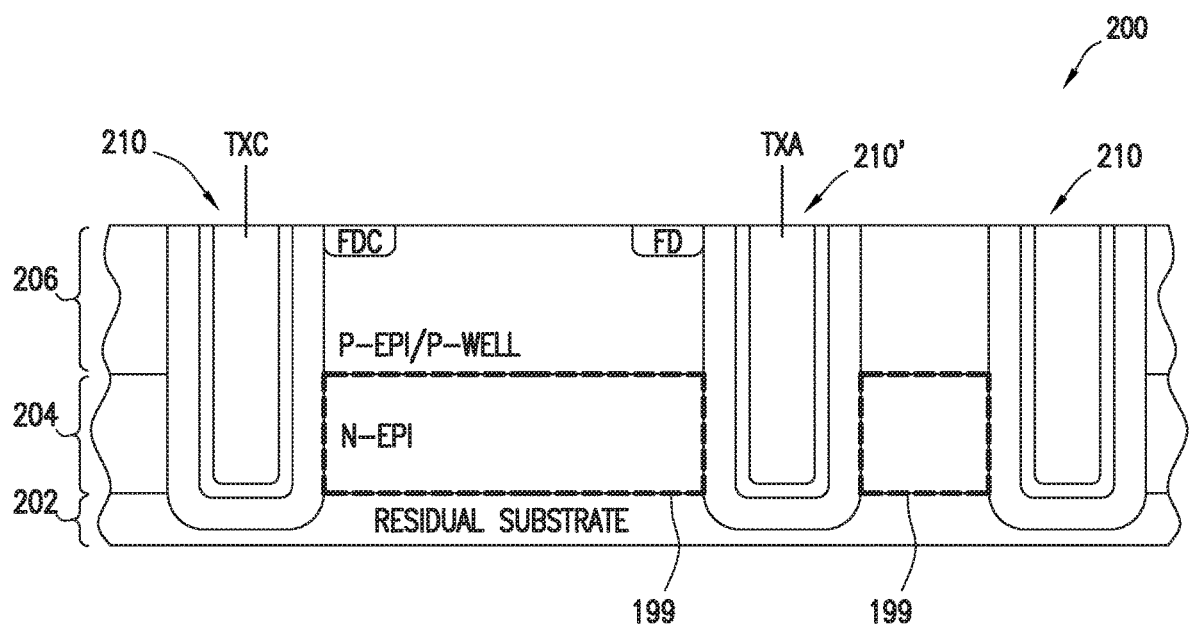

FIG. 3I shows another example that is a variation of the photodiode configuration of FIG. 3A. As shown in FIG. 3I, sensor 200 may include vertical transfer gate structures 210 (controlled by signal TXC), which defines the border of the photodiode, and may also include an additional vertical transfer gate structure 210' (controlled by signal TXA). Vertical transfer gate 210 may be configured to transfer charge from region 199 to floating diffusion region FDC, whereas vertical transfer gate 210' may be configured to transfer charge from region 199 to floating diffusion region FD.

Figure 3J:
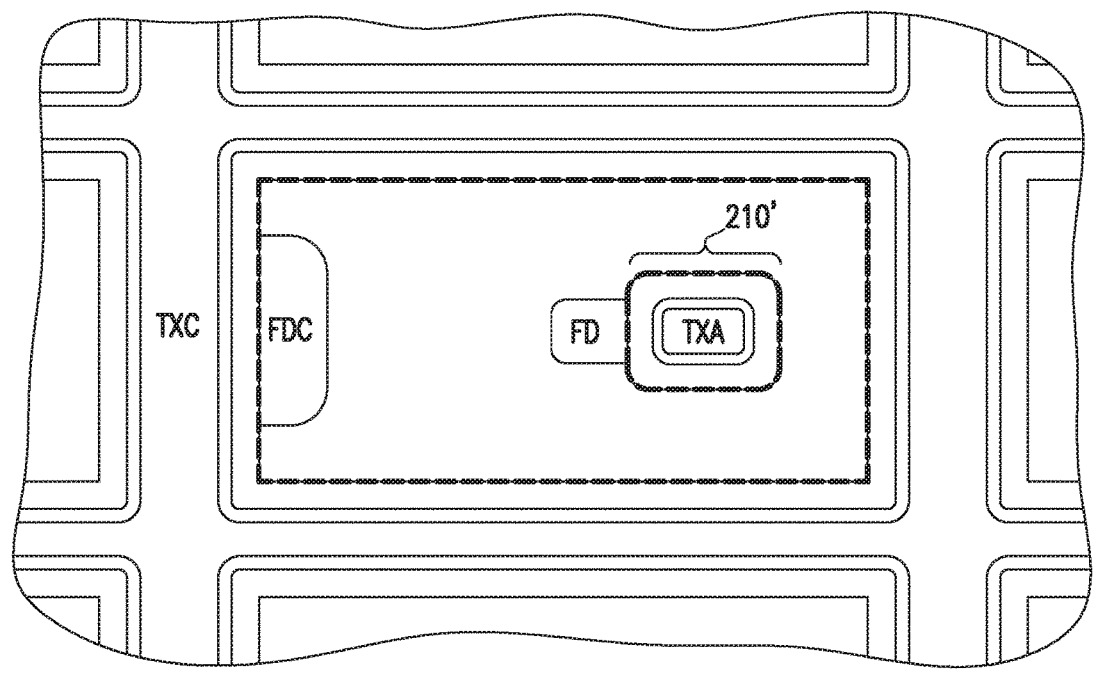

FIG. 3J is a top view of image sensor 200 shown in FIG. 3I. As shown in FIG. 3J, charge transfer gate 210' might be a single deep trench pillar or column while structures 210 form a grid. In other words, vertical transfer gate 210 may be configured as a matrix or mesh of trenches that form an array of slots in which respective photodiodes are formed. Floating diffusion regions FD and FDC may have smaller footprints than photodiode region 199 and may be formed directly above region 199. If desired, this configuration in which an additional vertical pillar transfer gate is used may be extended to embodiments having two or more separate n-epi layers (see, e.g., the embodiments of FIGS. 3C and 3E).

The embodiment of FIGS. 3I and 3J in which sensor 200 includes a pillar-like or a single-column vertical transfer gate surrounded by grid-like structures is merely exemplary. If desired, more than one pillar-like vertical transfer gates may be formed in each photodiode region (e.g., two or more separate column vertical transfer gate may be formed in each slot of the surrounding grid).

Moreover, the embodiment of FIGS. 3I and 3J in which the grid structure serves as a vertical transfer gate is also illustrative. If desired, the grid-like structures may instead be formed using deep p-well structures (see, e.g., deep p-well structures 250 in FIGS. 2A and 2C) and/or deep trench isolation structures (see, e.g., FIG. 2D).

FIG. 3K is an exemplary circuit diagram of pixel 201 formed at least partially using the photodiode configuration of FIGS. 3I and 3J. As shown in FIG. 3K, pixel 201 may include a photodiode (corresponding to region 199 of FIG. 3I). A grid-like vertical transfer gate (controlled by signal TXC) may be coupled between the photodiode and floating diffusion node FDC. Node FDC may be selectively coupled to an anti-blooming power supply terminal Vaapix (as an example). A single pillar vertical transfer gate (controlled by signal TXA) may be coupled between the photodiode and floating diffusion node FD. Various pixel readout transistors (e.g., reset transistors, source follower transistors, row select transistors, etc.) may be coupled to floating diffusion node FD but are not shown in FIG. 3K to prevent unnecessarily obscuring the present embodiments.

Figure 3L:
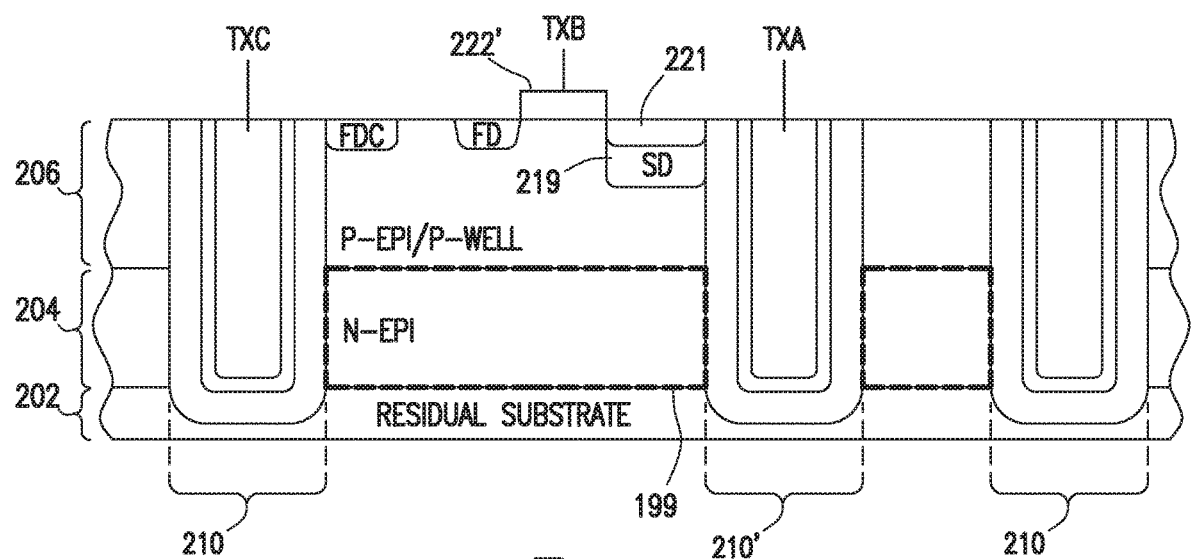

FIG. 3L shows another example that is a variation of the photodiode configuration of FIG. 3I. As shown in FIG. 3L, vertical charge transfer gate 210' may be directly in contact with photodiode region 199 but not floating diffusion region FD. Vertical transfer gate 210' may also directly contact n-well region 219, which can serve as a storage diode (SD) or a memory node. If desired, an optional shielding region such as shallow p-type implant region 221 may be formed at the surface of layer 206 directly above storage diode region 219. A charge transfer gate 222' (controlled by signal TXB) may be coupled between n-well 219 and floating diffusion region FD. Additional front-side pixel structures such as reset gates, source follower transistors, and row-select transistors are not shown so as not to unnecessarily obscure the present embodiment.

Configured in this way, vertical transfer gate 210' may be used to transfer charge from photodiode region 199 to n-well region 219 (e.g., be selectively asserting control signal TXA). This example in which vertical transfer gate 210' conveys charge from a single epitaxial region 199 to storage diode region 219 is merely illustrative. If desired, this configuration may be extended to support two or more separate n-epi layers (see, e.g., the embodiments of FIGS. 3C and 3E).

Figure 3M:
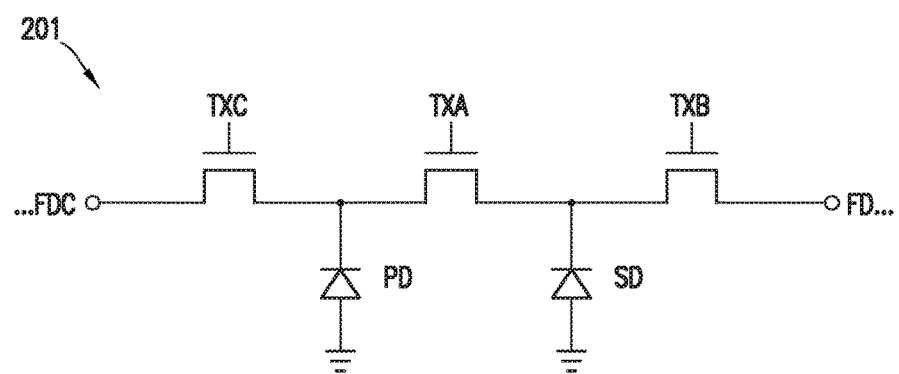

FIG. 3M is an exemplary circuit diagram of pixel 201 formed at least partially using the photodiode configuration of FIG. 3L. As shown in FIG. 3M, pixel 201 may include a photodiode (corresponding to region 199 of FIG. 3L) and a storage/memory diode (corresponding to n-well region 219 of FIG. 3L). A single-column vertical transfer gate (controlled by signal TXA) may be coupled between the photodiode and the storage diode. A separate horizontal transfer gate (controlled by signal TXB) may be coupled between the storage diode and floating diffusion node FD. Grid-like vertical transfer gate structures (controlled by signal TXC) may be coupled between the photodiode and floating diffusion node FDC. Node FDC may be selectively coupled to an anti-blooming power supply terminal Vaapix or other reference voltage levels (as examples). Various pixel readout transistors (e.g., reset transistors, source follower transistors, row select transistors, etc.) may be coupled to node FD but are not shown in FIG. 3M to prevent unnecessarily obscuring the present embodiments.

Figure 3N:
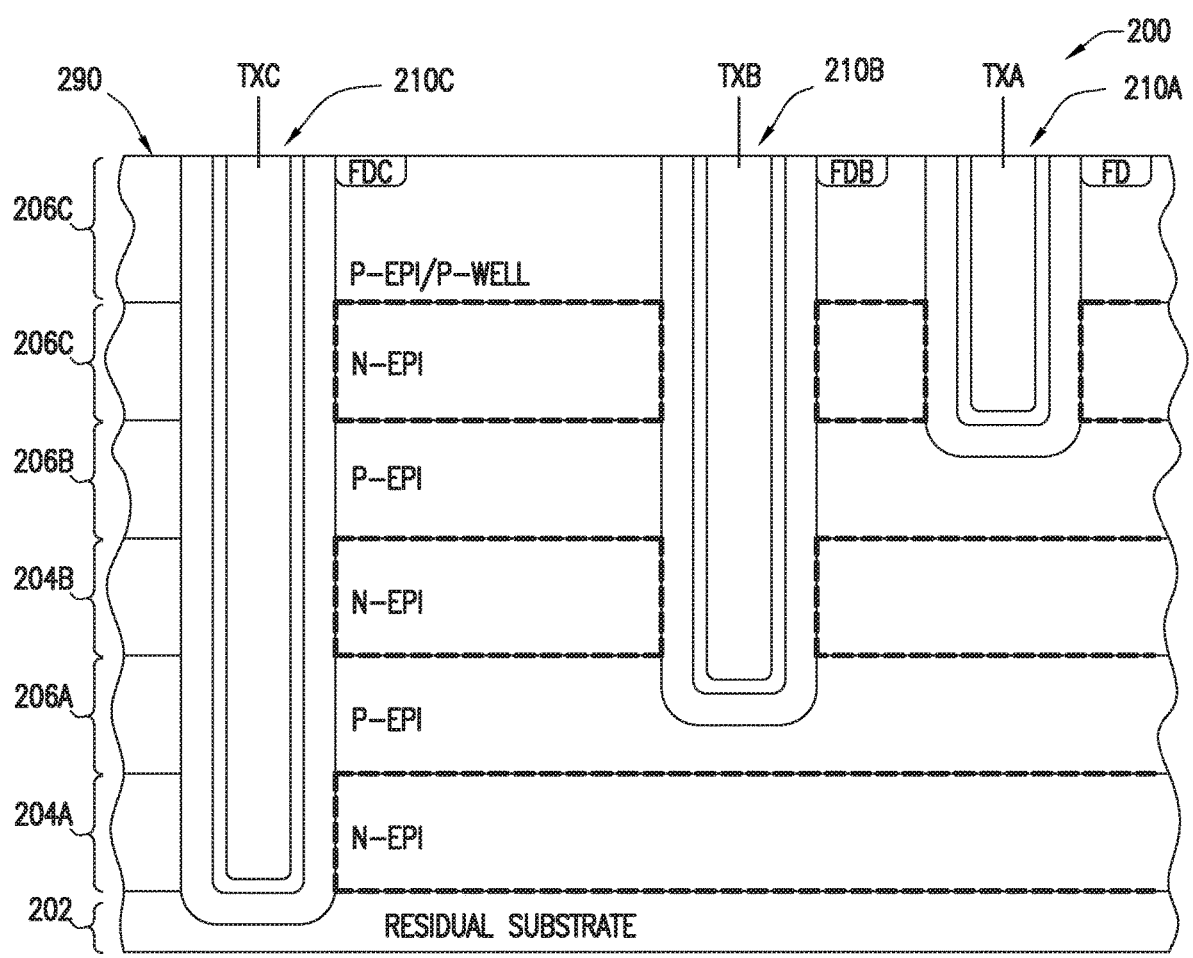

FIG. 3N shows yet another suitable embodiment in which sensor 200 includes at least three separate n-epi layers 204. As shown in FIG. 3N, sensor may include a first n-epi layer 204A grown on residual substrate 202, a first p-epi layer 206A grown on n-epi layer 204A, a second n-epi layer 204B grown on p-epi layer 206A, a second p-epi layer 206B grown on n-epi layer 204B, a third n-epi layer 204C grown on p-epi layer 206B, and a third p-epi layer 206C grown on n-epi layer 204C. Optionally, layer 206C may also be a layer in which a p-well is formed.

Sensor 200 may include vertical transfer gate structures 210A, 210B, and 210C with different depths. Vertical transfer gate structure 210C (controlled by signal TXC) may extend from front surface 290 all the way down to residual substrate 202. In this example, vertical transfer gate 210C may be coupled to (and in contact with) layers 204A, 204B, 204C, and to floating diffusion region FDC. Vertical transfer gate structure 210B (controlled by signal TXB) may extend from front surface 290 all the way down and partially into layer 206A. Vertical transfer gate 210B may be coupled to (and in contact with) layers 204B, 204C, and to floating diffusion region FDB. Vertical transfer gate structure 210A (controlled by signal TXA) may extend from front surface 290 downwards and partially into layer 206B. Vertical transfer gate 210C may only be coupled to (and in contact with) layer 204C and to floating diffusion region FD. In general, floating diffusion regions FDB and FDC in layer 206C are optional.

Figure 3O:
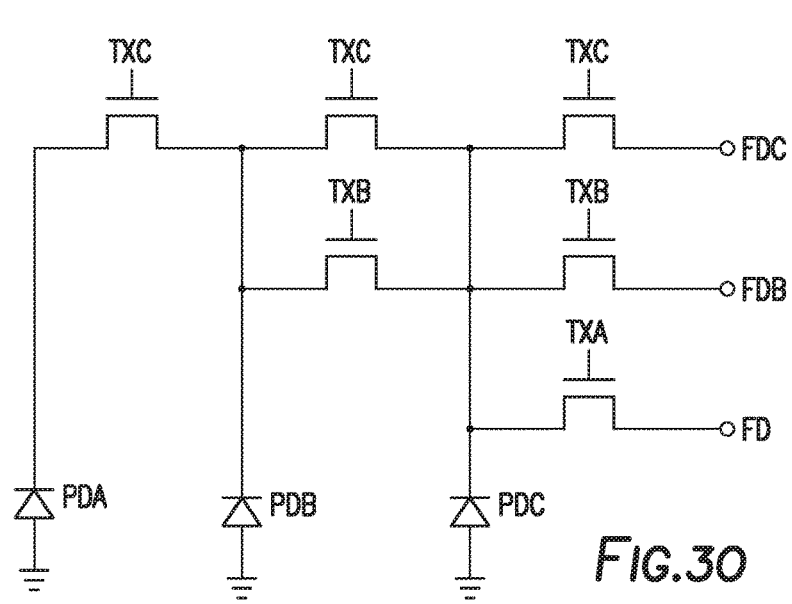

FIG. 3O is an exemplary circuit diagram of pixel 201 formed at least partially using the photodiode configuration of FIG. 3N. As shown in FIG. 3O, pixel 201 may include a first photodiode PDA (corresponding to the dotted region in layer 204A), a second photodiode PDB (corresponding to the dotted region in layer 204B) that is vertically stacked on top of PDA, and a third photodiode PDC (corresponding to the dotted region in layer 204C) that is vertically stacked on top of PDB.

A first vertical transfer gate may be selectively activated by asserting signal TXC to simultaneously transfer charge from PDA, PDB and PDC to floating diffusion node FDC. A second vertical transfer gate may be selectively activated by asserting signal TXB to simultaneously transfer charge from PDB and PDC to floating diffusion node FDB. A third vertical transfer gate may be selectively activated by asserting signal TXA to transfer charge from PDC to floating diffusion node FD. In the scenario where pixel 201 of FIG. 3O does not include floating diffusion nodes FDB and FDC, the first vertical transfer gate may serve to transfer charge from PDA and PDB to PDC, whereas the second vertical transfer gate may serve to transfer charge from PDB to PDC. In this case, the third vertical transfer gate may be subsequently switched into use to transfer any accumulated and transferred charge from PDC to node FD.

The example of FIG. 3N in which sensor 200 includes three vertical transfer gates of different depths/lengths is merely illustrative. If desired, image sensor 200 may include vertical transfer gates of at least two different depths or at least four different depths, at least a portion of which includes grid-like vertical transfer gate structures and at least another portion of which includes single pillar/column vertical transfer gate structures. The vertical gates of different depths can be used to read out any of the deep photodiodes to the front surface or to transfer between any number of buried diodes.

Figure 4A:
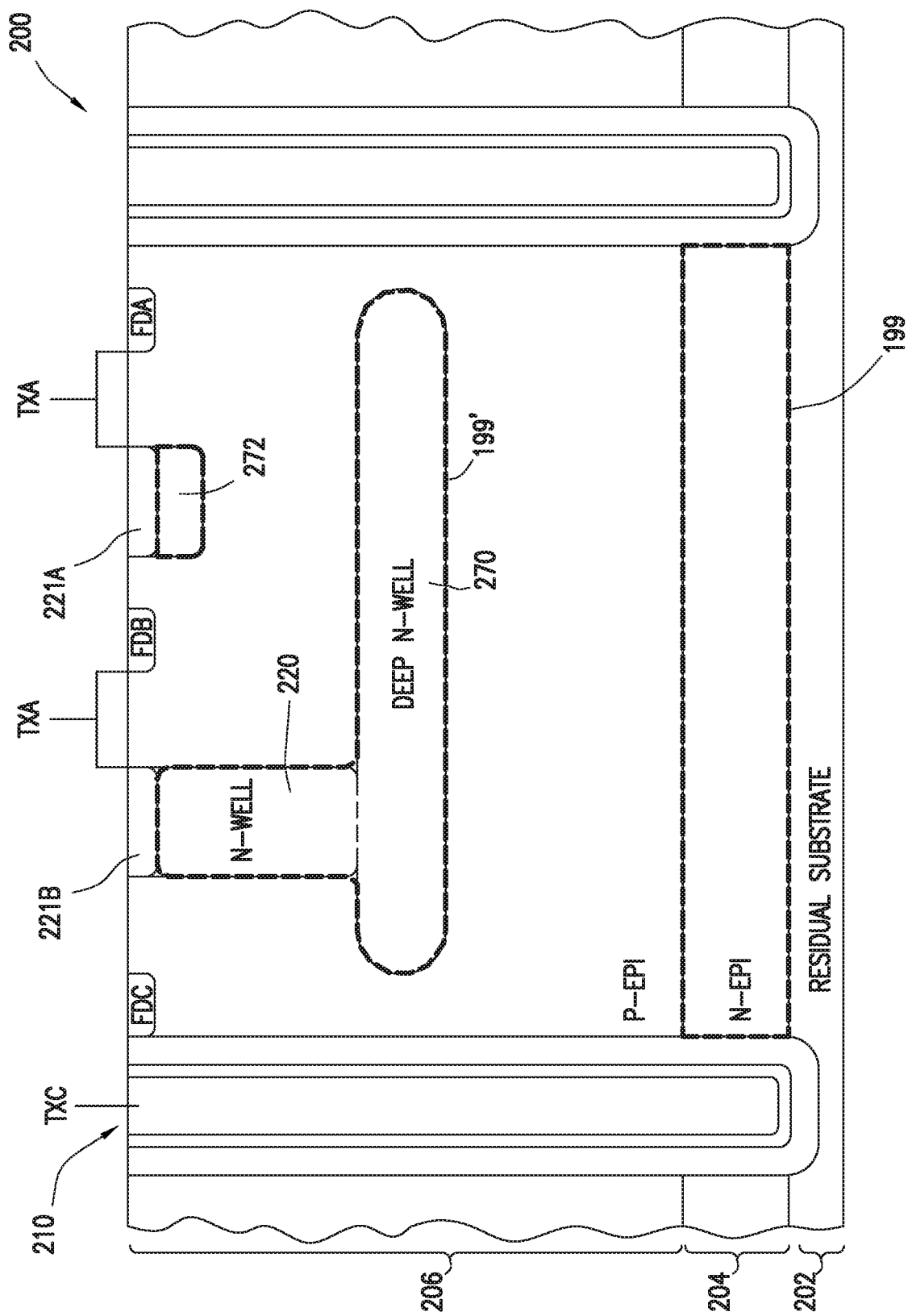
FIGS. 4A-4D are diagrams showing different structures that can be formed in an upper p-type layer in accordance with at least some embodiments.

FIG. 4A illustrates another example in which sensor 200 includes a number of additional structures in the top p-epi layer 206. As shown in FIG. 4A, a deep implant photodiode formed from deep n-well 270 and n-well 220 may be formed in layer 206 (collectively marked as region 199'). An optional shielding region such as shallow p-type implant region 221B may be formed at the surface of layer 206 directly above n-well 220. A shallow implant photodiode formed from shallow n-well 272 may also be formed in layer 206 above deep n-well 270. An optional shielding region such as shallow p-type implant region 221A may be formed at the surface of layer 206 directly above shallow n-well 272.

In the example of FIG. 4A, a first horizontal transfer gate (controlled by signal TXA) may be configured to transfer accumulated charge from the shallow implant photodiode (e.g., charge in n-well region 272) to floating diffusion region FDA. A second horizontal transfer gate (controlled by signal TXB) may be configured to transfer accumulated charge from the deep implant photodiode (e.g., charge in n-type region 199') to floating diffusion region FDB. Vertical transfer gate 210 (controlled by signal TXC) may be configured to transfer accumulated charge from the deep epitaxial photodiode (e.g., charge in n-epi region 199) to floating diffusion region FDC.

If desired, other types of pixel readout circuitry and semiconductor components can also be formed in layer 206. The configuration of FIG. 4A may be extended to support multiple epitaxial photodiode regions, grid-like and single-pillar vertical transfer gates, vertical transfer gate structures of different depths, one or more floating diffusion regions, one or more photodiodes or storage diodes, etc.

Figure 4B:
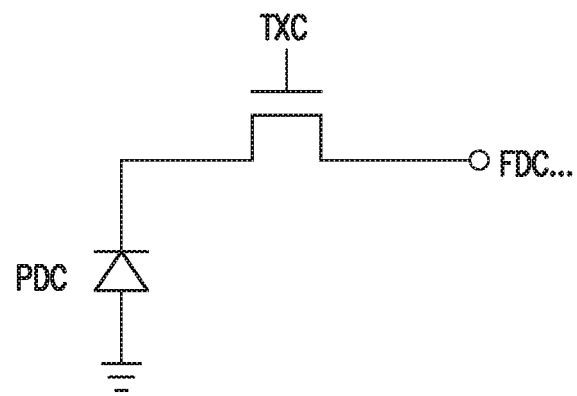
Figure 4B:
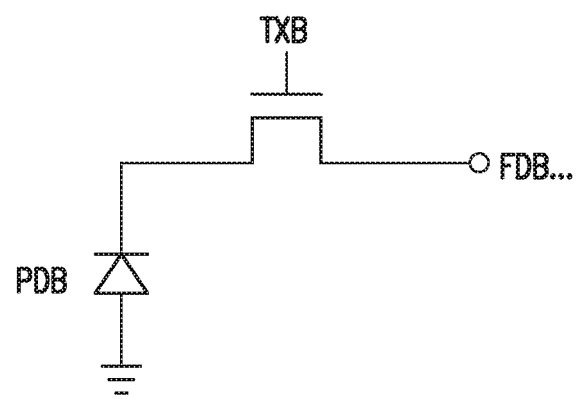
Figure 4B:
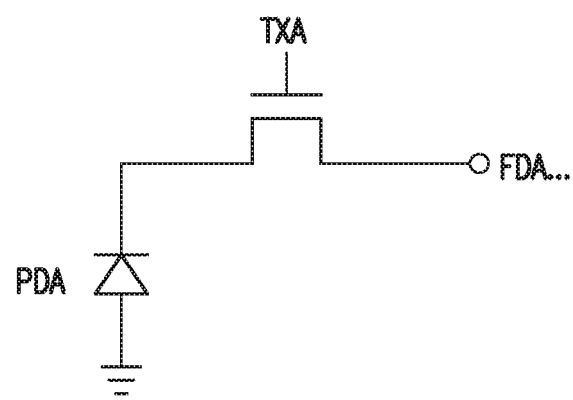

FIG. 4B is an exemplary circuit diagram of pixel 201 formed at least partially using the photodiode configuration of FIG. 4A. As shown in FIG. 4B, pixel 201 may include a first photodiode PDA (corresponding to region 199 in FIG. 4A), a second photodiode PDB (corresponding to region 199') that is vertically stacked on top of PDA, and a third photodiode PDC (corresponding to region 272) that is vertically stacked on top of PDB.

Photodiode PDA (e.g., an epitaxial-layer-based photodiode) may convey accumulated charge to floating diffusion node FDA via a first charge transfer gate (e.g., a horizontal charge transfer gate that is controlled by signal TXA). Photodiode PDB (e.g., a deep implanted photodiode) may convey accumulated charge to floating diffusion node FDB via a second charge transfer gate (e.g., a horizontal charge transfer gate that is controlled by signal TXB). Photodiode PDC (e.g., a shallow implanted photodiode) may convey accumulated charge to floating diffusion node FDC via a third charge transfer gate (e.g., a vertical deep trench charge transfer gate that is controlled by signal TXC). Various pixel readout transistors (e.g., reset transistors, source follower transistors, row select transistors, etc.) may be coupled to floating diffusion nodes FDA, FDB, and FDC but are not shown in FIG. 4B to prevent unnecessarily obscuring the present embodiments.

Figure 4C:
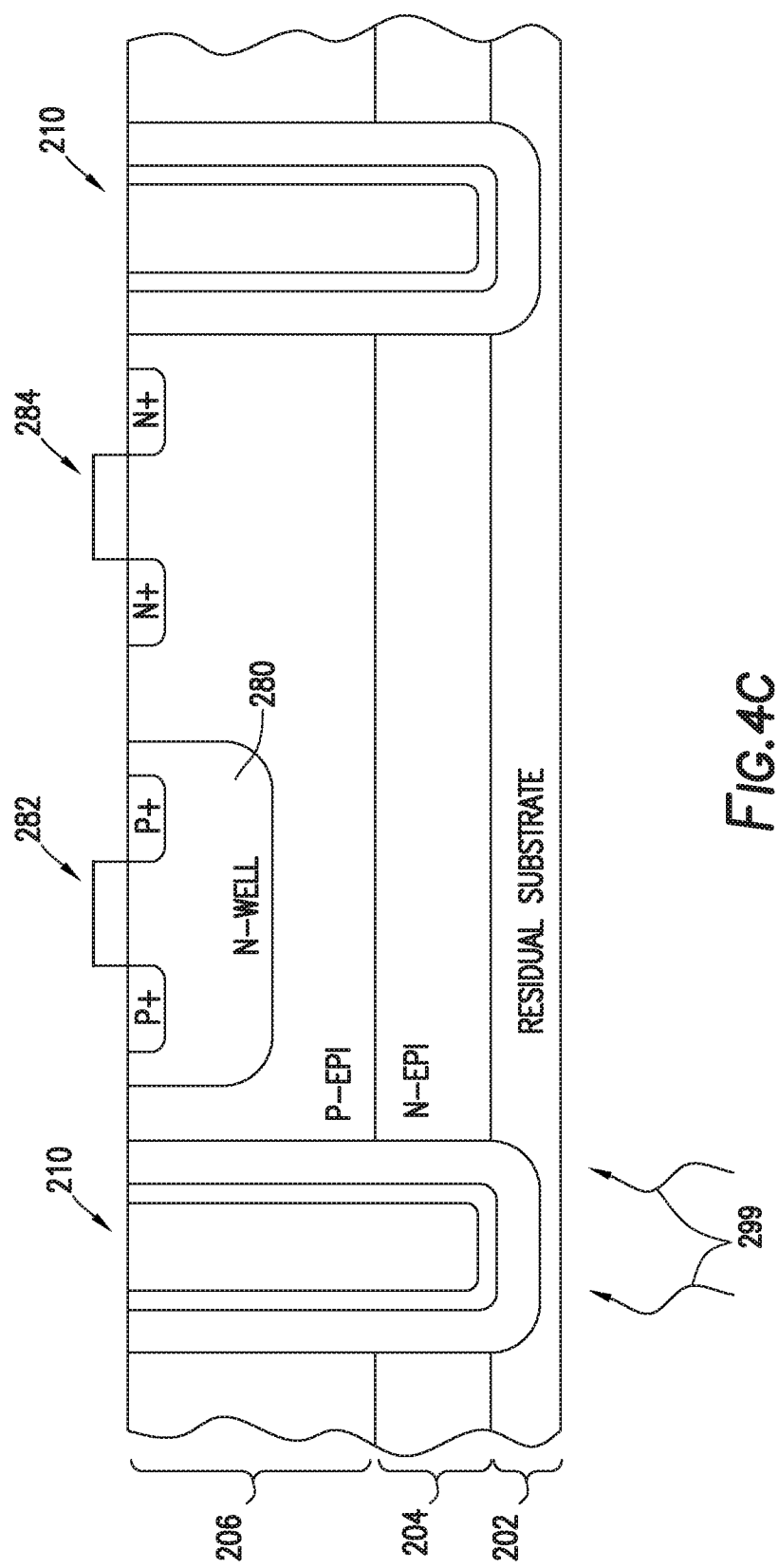

FIG. 4C illustrates another example in which sensor 200 can include both n-type devices (e.g., n-channel metal-oxide-semiconductor or "NMOS" transistors) and p-type devices (e.g., p-channel metal-oxide-semiconductor or "PMOS" transistors) formed in top layer 206. As shown in FIG. 4C, one or more NMOS transistor 284 and PMOS transistor 282 may be formed in layer 206. P-channel transistor 282 may be formed in an n-well such as n-well region 280 in layer 206. The configuration of FIG. 4C may be extended to support multiple epitaxial photodiode regions, grid-like and single-pillar vertical transfer gates, vertical transfer gate structures of different depths, one or more floating diffusion regions, one or more photodiodes or storage diodes, etc.

Figure 4D:
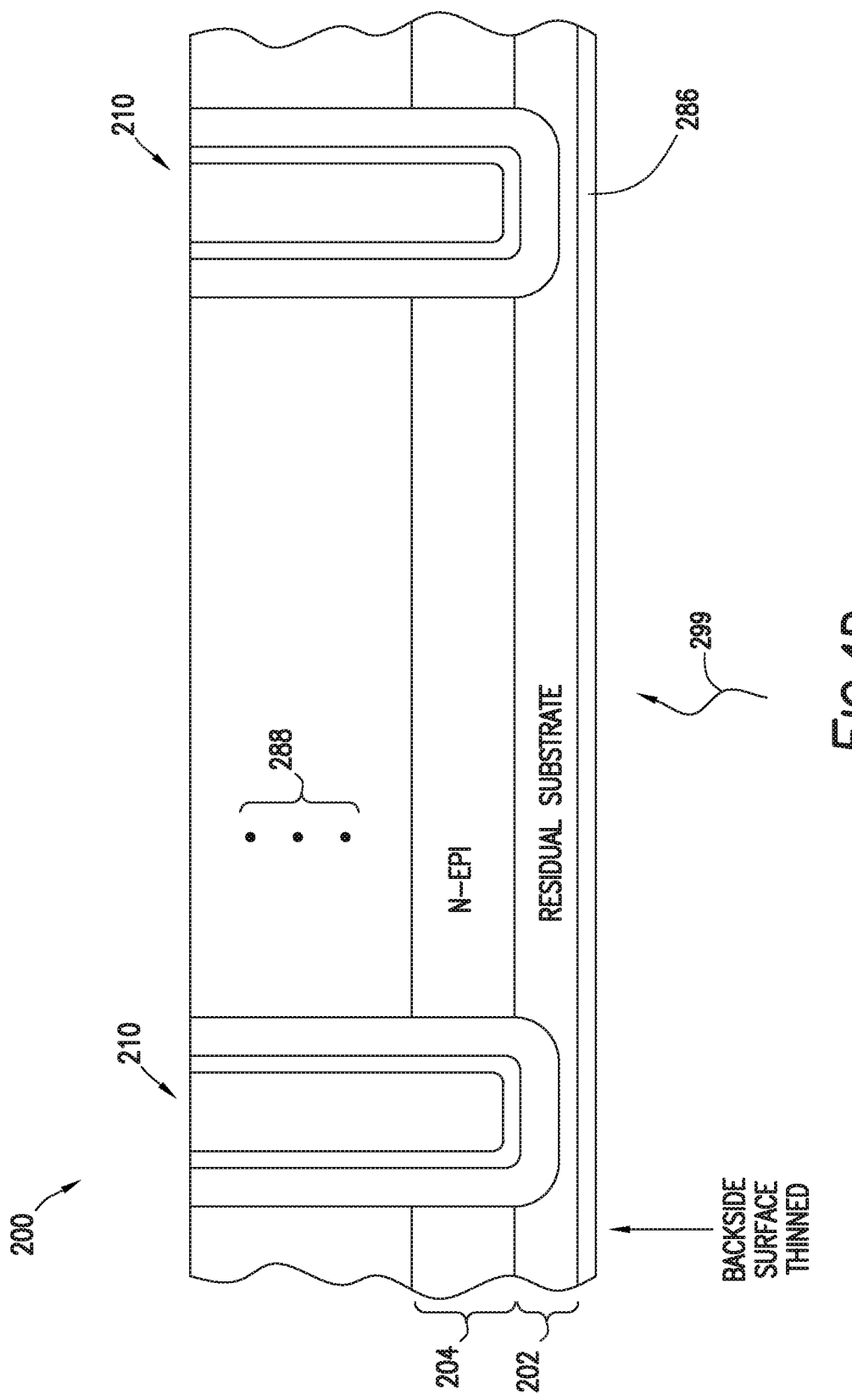

FIG. 4D further illustrates how residual substrate 202 may be thinned from the backside to reduce the thickness of substrate 202. Any type of semiconductor structures or any number of additional n-type or p-type layers/wells/regions may be formed above n-epi layer 204, as indicated by ellipses 288. Moreover, a backside passivation layer 286 (e.g., a film that may be formed using a shallow p-type implant) may be formed at the back surface of sensor 200 after the thinning process. The backside thinning step and backside passivation liner 286 may also be applied to sensor 200 of the type shown in the embodiments of FIGS. 2A-2D, 3A-3O, and 4A-4C.

Figure 5:
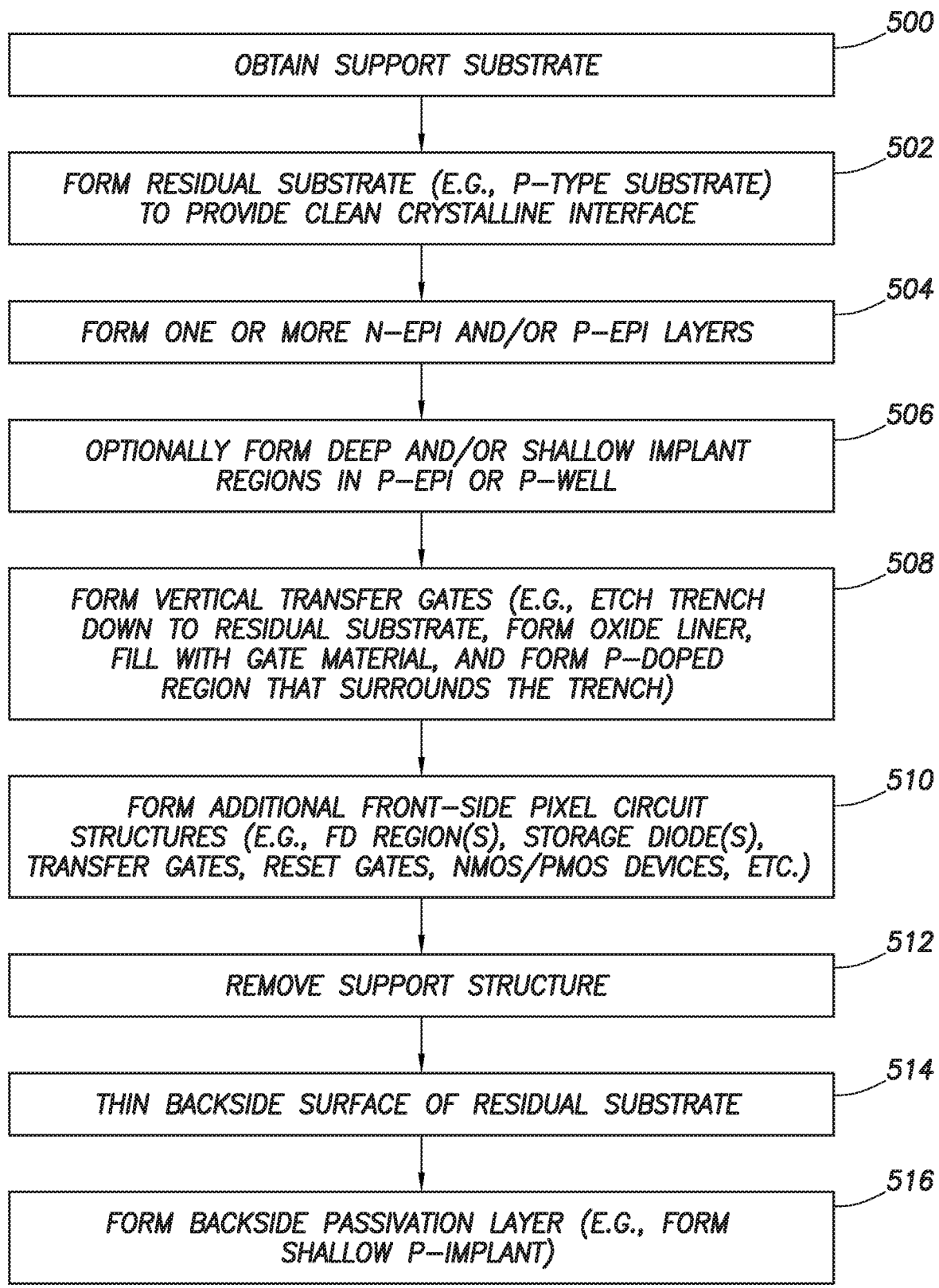
FIG. 5 is a flow chart of illustrative steps for fabricating an image sensor of the type shown in connection with FIGS. 2-4 in accordance with an embodiment.

FIG. 5 is a flow chart of illustrative steps for fabricating an image sensor of the type shown in connection with FIGS. 2-4. At step 500, a support substrate (sometimes referred to as a substrate or a carrier substrate) may be obtained. The support substrate may either be p-doped or n-doped.

At step 502, a residual substrate layer may be formed on the support substrate. In the example where a p-type support substrate is used, a residual p-type substrate layer may be formed over the support substrate to provide a clean crystalline interface for subsequent epitaxial growth. In another example where an n-type support substrate is used, a residual n-type substrate layer may be formed over the support substrate to provide a clean crystalline interface for subsequent epitaxial growth.

At step 504, one or more n-type epitaxial and/or p-type epitaxial layers may be formed on the residual substrate layer. In general, the epitaxial layers may be alternating n-epi and p-epi layers. Each of the epitaxial layers formed during step 504 may have different thicknesses or the same thickness and any suitable dopant concentration profile. At step 506, one or more deep or shallow implant regions may optionally be formed in the uppermost p-type layer or well.

At step 508, vertical charge transfer gate structures may be formed through the epitaxial layers and at least partially through the residual substrate layer. To form the vertical charge transfer gate structures, a trench may first be etched from the front surface all the way down to the residual substrate, an oxide liner may then be formed, and the trench may subsequently be filled with doped gate conductive material. The dopant in the gate material may then be diffused through the gate oxide liner to form the p-type region surrounding the oxide liner (see, e.g., p-type region 216 in at least FIGS. 3A-3C, 3E, 3G, etc.). Alternatively, the oxide liner might be p-doped to provide the dopant for diffusing into region 216.

At step 510, additional front-side pixel circuit structures such as floating diffusion regions, storage diodes, charge transfer gates, reset gates, source follower transistors, and/or row-select transistors may be formed on the second p-epi layer. Subsequent formation of a dielectric stack (sometimes referred to as an interconnect stack) may then be formed over the front-side pixel circuit structures for providing the desired electrical routing.

At step 512, the support substrate may then be removed. If desired, the support substrate may be removed prior to step 510. At step 514, backside thinning operations may be performed to thin the back surface of the residual substrate (e.g., via a Chemical Mechanical Planarization or "CMP" process). At step 516, a backside passivation layer (e.g., a backside film formed using shallow p-type implant) may be formed on the thinned backside surface of the residual substrate.

The steps of FIG. 5 are merely illustrative and are not intended to limit the scope of the present embodiments. In general, some of the steps may be omitted, additional steps may be inserted, and the order of steps may be altered. Moreover, the embodiments described above in connection with FIGS. 2-5 in which certain portions are n-type while others are p-type are merely exemplary. In other suitable embodiments, the doping types can swapped (e.g., the regions currently described as n-type may instead be p-doped, and the regions currently described as p-type may instead be n-doped).

Figure 6A:
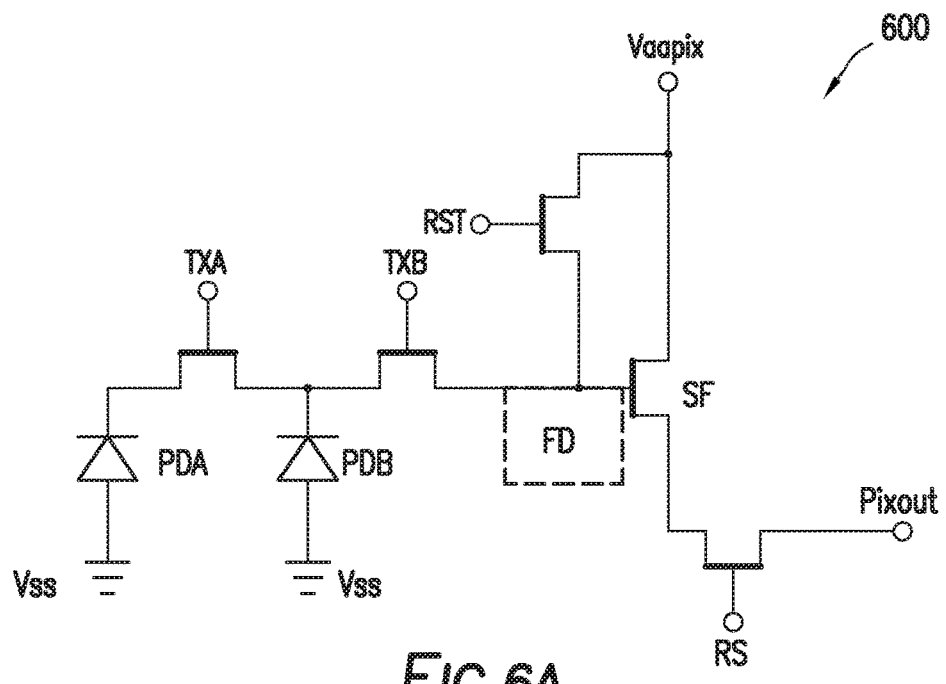
FIG. 6A is a circuit diagram of an image sensor pixel having two vertically stacked photodiodes in accordance with an embodiment.

FIG. 6A is a circuit diagram of an image sensor pixel such as pixel 600 having two vertically stacked photodiodes in accordance with an embodiment. As shown in FIG. 6A, pixel 600 may include a first photodiode PDA (e.g., a photodiode that includes an n-type epitaxial layer), a second photodiode PDB (e.g., a photodiode that includes either an n-type epitaxial layer or an n-type implant region), a floating diffusion region FD, a first charge transfer gate (controlled by signal TXA) for transferring charge from PDA to PDB, a second charge transfer gate (controlled by signal TXB) for transferring charge from PDB to FD, a reset transistor (controlled by signal RST) coupled between power supply line Vaapix and the floating diffusion node, and a source follower transistor SF having a drain terminal coupled to power supply line Vaapix, a gate terminal shorted to the floating diffusion node, and a source terminal that is coupled to pixel output line Pixout via a row select transistor (controlled by signal RS). The p-type terminal of each photodiode may be shorted to ground power supply line Vss (usually via p-type structures). In general, the reset transistor, source follower transistor, row-select transistors, and other pixel readout transistors may be formed in the top front-side layer (e.g., layer 206 or 206B shown in FIGS. 2-4).

Configured in this way, photodiode PDA may have a first pinning potential level, photodiode PDB may have a second pinning potential level that is higher than the first pinning potential, and the floating diffusion region should have a third potential level that is even higher than the second pinning potential. When reading signals out from pixel 600, accumulated charge may first be transferred from PDB to the floating diffusion region by asserting signal TXB during a first time period. During a second time period following the first time period, charge may then be transferred from PDA to the floating diffusion region by simultaneously asserting signals TXA and TXB.

Figure 6B:
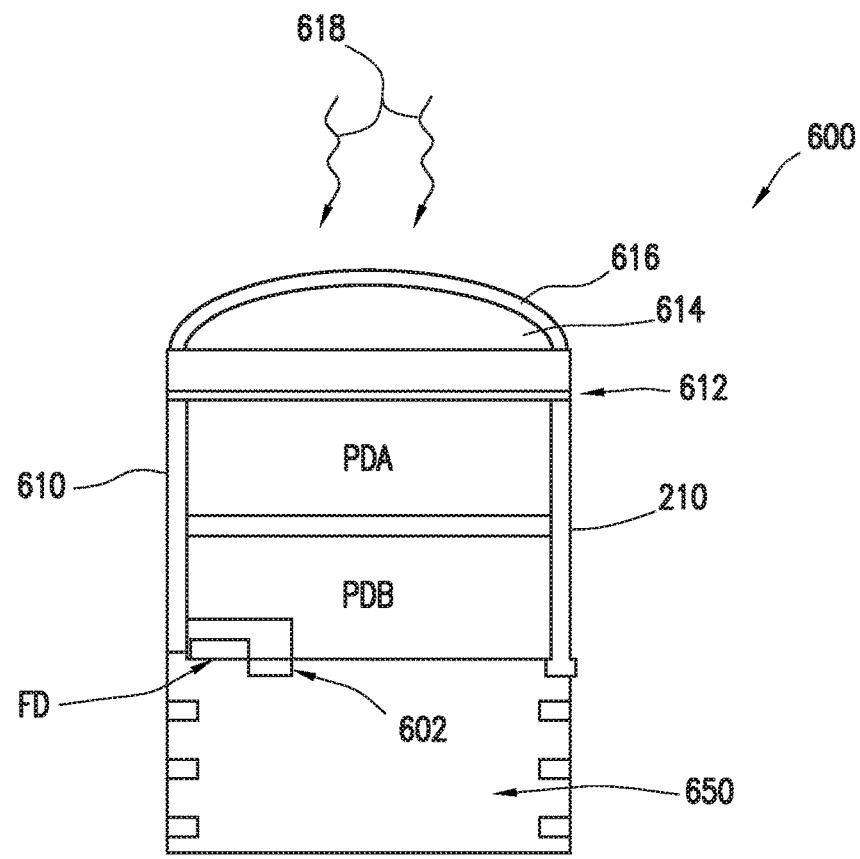
FIG. 6B is a cross-sectional side view of the pixel circuit of FIG. 6A in accordance with an embodiment.

FIG. 6B is a cross-sectional side view of pixel circuit 600 of FIG. 6A. As shown in FIG. 6B, pixel 600 may include vertically stacked photodiodes PDA and PDB (e.g., photodiodes formed using epitaxial layers and/or diffusion regions as shown in FIGS. 2-4), vertical transfer gate 210 for conveying charge from PDA to PDB, and transfer gate 602 for conveying charge from PDB to the floating diffusion region. Pixel isolation region 610 may at least partially surround the vertically stacked photodiodes and may be implemented using DTI structures 210' shown in FIGS. 2-4.

The surface at which transistor 602 is formed is typically referred to as the "front" side. Transistor 602 transfers charge to the floating diffusion region along the front surface and is therefore sometimes referred to as a "horizontal" transfer gate. An interlayer dielectric (ILD) stack 650 that may include interconnect pathways for coupling together the various pixel components may be formed over the front surface. Silicon antireflective coating (ARC) material 612 may be formed on the back side of the sensor. Microlens 614 may be formed over ARC film 612, and microlens ARC liner may be formed over microlens 614. Image sensor having multiple vertically stacked photodiodes can either include a color filter array (CFA) or need not include any color filter components (i.e., a separate color filter array might not be needed or used). As shown in the example of FIG. 6B, light 618 may enter from the back side of the image sensor. This type of imaging configuration is referred to as backside illumination (BSI). If desired, vertically stacked photodiodes and vertical deep trench transfer gates may also be used to support front side illumination (FSI), where light enters from the front side of the sensor through interconnect stack 650.

Figure 7A:
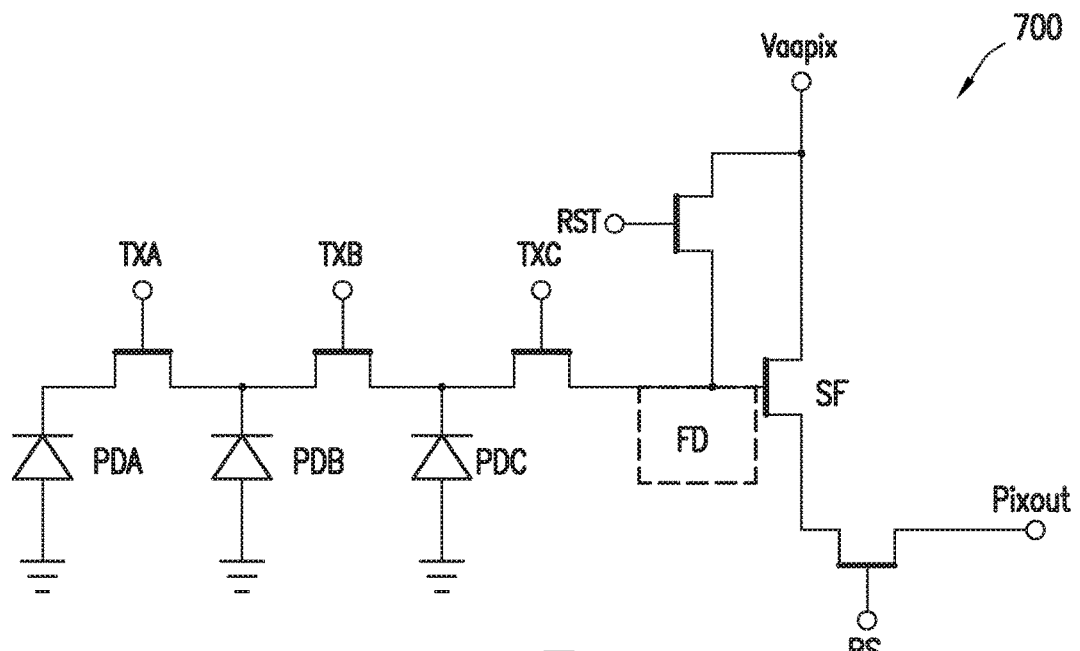
FIG. 7A is a circuit diagram of an image sensor pixel having three vertically stacked photodiodes in accordance with an embodiment.

FIG. 7A is a circuit diagram of an image sensor pixel such as pixel 700 having three vertically stacked photodiodes in accordance with an embodiment. As shown in FIG. 7A, pixel 700 may include a first photodiode PDA, a second photodiode PDB, a third photodiode PDC (e.g., a photodiode that includes either an n-type epitaxial layer or an n-type implant region), a floating diffusion region FD, a first charge transfer gate (controlled by signal TXA) for transferring charge from PDA to PDB, a second charge transfer gate (controlled by signal TXB) for transferring charge from PDB to PDC, a third charge transfer gate (controlled by signal TXC) for transferring charge from PDC to floating diffusion region FD, a reset transistor (controlled by signal RST) coupled between power supply line Vaapix and the floating diffusion node, and a source follower transistor SF having a drain terminal coupled to power supply line Vaapix, a gate terminal shorted to the floating diffusion node, and a source terminal that is coupled to pixel output line Pixout via a row select transistor (controlled by signal RS).

Configured in this way, photodiode PDA may have a first pinning potential level, photodiode PDB may have a second pinning potential level that is higher than the first pinning potential, photodiode PDC may have a third pinning potential level that is higher than the second pinning potential, and the floating diffusion region may have a fourth potential level that is even higher than the third pinning potential. When reading signals out from pixel 700, accumulated charge may first be transferred from PDC to the floating diffusion region by asserting signal TXC during a first time period. During a second time period following the first time period, accumulated charge may then be transferred from PDB to the floating diffusion region by simultaneously asserting signals TXB and TXC. During a third time period following the second time period, accumulated charge may then be transferred from PDA to the floating diffusion region by simultaneously asserting signals TXA, TXB, and TXC.

Figure 7B:
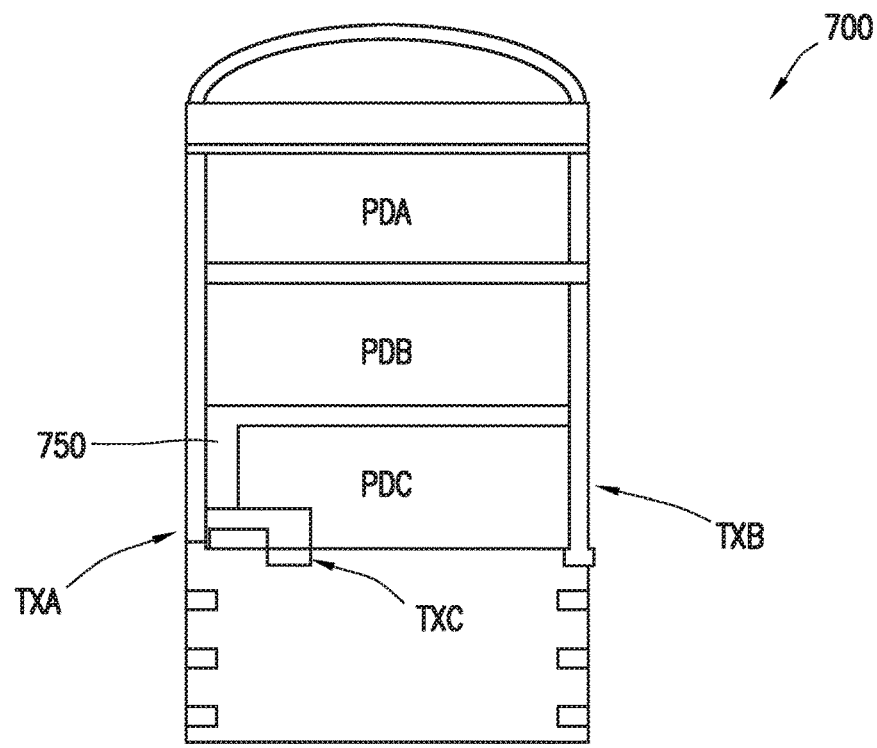
FIG. 7B is a cross-sectional side view of the pixel circuit of FIG. 7A in accordance with an embodiment.

FIG. 7B is a cross-sectional side view of pixel circuit 700 of FIG. 7A. As shown in FIG. 7B, pixel 700 may include vertically stacked photodiodes PDA, PDB, and PDC (e.g., photodiodes formed using epitaxial layers and/or diffusion regions as shown in FIGS. 2-4), vertical transfer gate TXA for conveying charge from PDA to PDB, vertical transfer gate TXB for conveying charge from PDB to PDC, and horizontal transfer gate TXC for conveying charge from PDC to the floating diffusion region. Similar front side and back side structures as FIG. 6B need not be reiterated to avoid duplicative description.

In particular, vertical transfer gate TXA may only serve to transfer charge from PDA to PDB but not to PDC. This may be accomplished by having a p-doped region 750 separating photodiode PDC from gate TXA. In one suitable arrangement, photodiode PDC may be formed via implantation (see, e.g., the configuration of FIG. 4 in which upper photodiode is formed by implanting an n-well in a p-epi layer). In another suitable arrangement, photodiode PDC may be an epitaxial photodiode, but counter-doping may be used to form a counter-doped p-region that isolates the n-epi layer of PDC from the vertical deep trench gate.

Figure 8A:
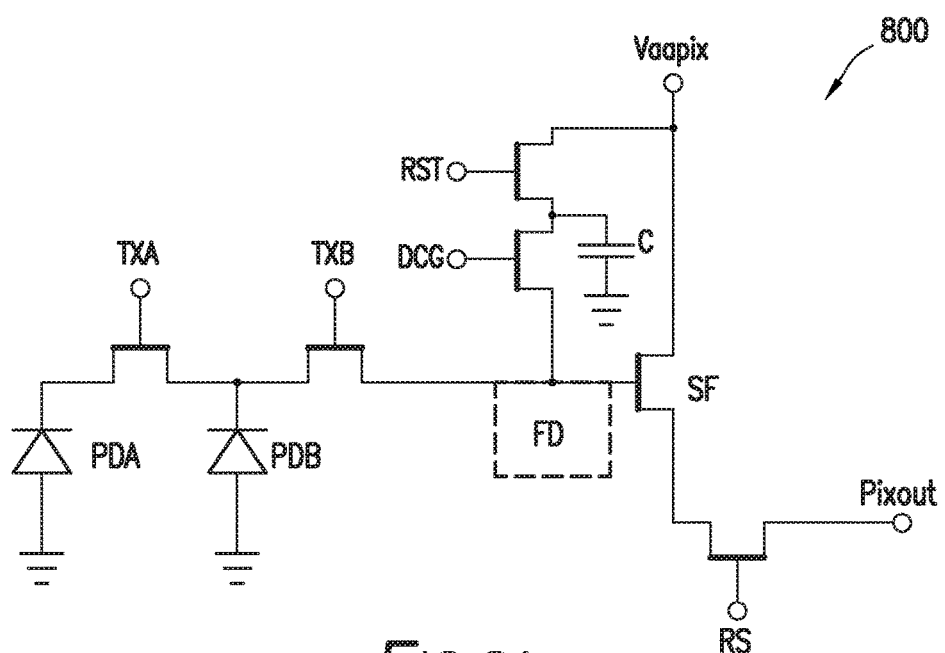
FIG. 8A is a circuit diagram of a dual conversion gain image sensor pixel operable using a rolling shutter scheme in accordance with an embodiment.

FIG. 8A is a circuit diagram of a dual conversion gain image sensor pixel such as pixel 800 that is operable using a rolling shutter scheme in accordance with an embodiment. Compared to pixel 600 of FIG. 6A, pixel 800 may also be formed using at least two stacked photodiodes and vertical charge transfer structures and may include an additional dual conversion gain transistor (controlled by signal DCG) interposed between the floating diffusion node and the reset transistor. During readout operations, the DCG transistor may be selectively turned on or off to configure pixel 800 in either a low conversion gain mode or a high conversion gain mode. If the dual conversion gain transistor is turned on during charge transfer, the dual conversion gain transistor may present additional capacitance C to the floating diffusion node, which effectively places pixel 800 in a low conversion gain mode. If the dual conversion gain transistor is turned off during charge transfer, only the intrinsic capacitance will be seen at the floating diffusion node, which effectively places pixel 800 in a high conversion gain mode.

Figure 8B:
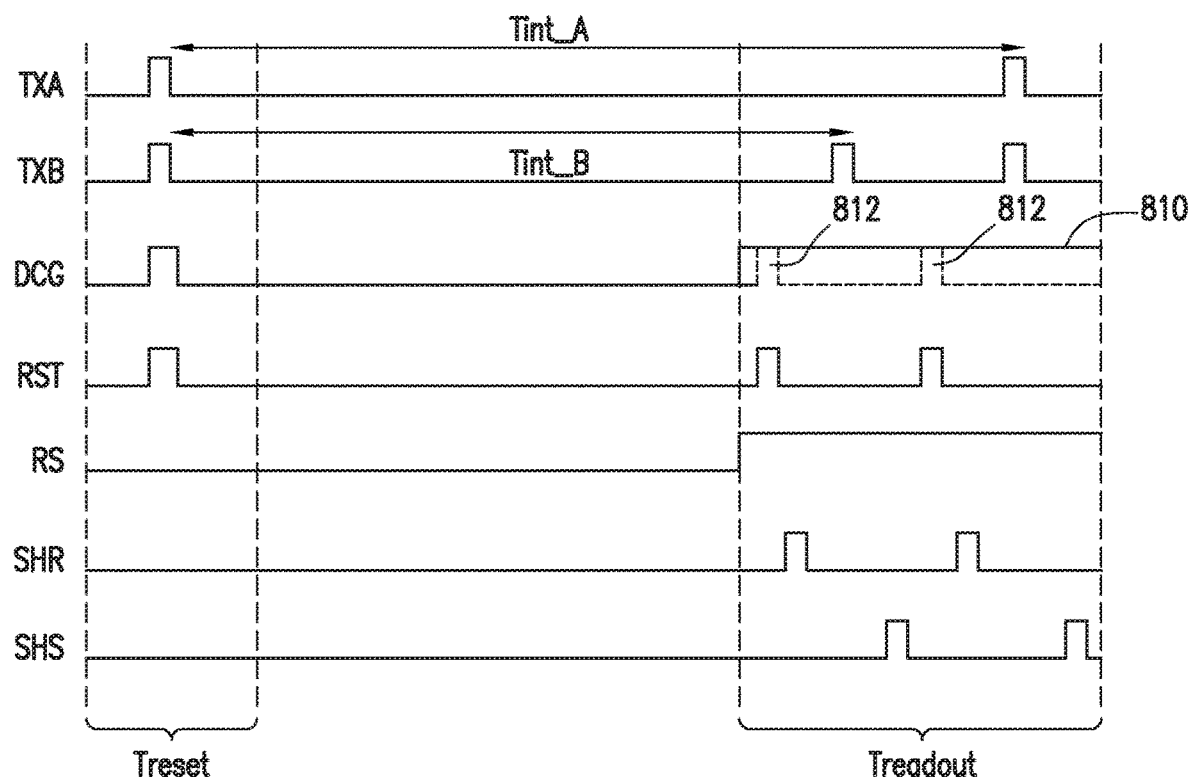
FIG. 8B is a timing diagram showing the behavior of relevant waveforms associated with operating the image sensor pixel of FIG. 8A in accordance with an embodiment.

FIG. 8B is a timing diagram showing the behavior of relevant waveforms associated with operating the image sensor pixel of FIG. 8A using a rolling shutter scheme. As shown in FIG. 8B, signals TXA, TXB, DCG, and RST may be simultaneously pulsed high during reset period Treset. Subsequently, photodiodes PDA and PDB are given time to integrate and accumulate charge.

During the readout period Treadout, row select signal RS may be asserted. Charge may first be read out from photodiode PDB by first pulsing signal RST, then sampling the reset level (e.g., represented by pulsing sample-hold-reset or "SHR" signal), pulsing signal TXB, and then sampling the transferred signal level (e.g., represented by pulsing sample-hold-signal or "SHS" signal). The time period from the initial reset pulse to TXB pulsing high during readout is the integration time Tint_B of photodiode PDB. Charge can then be read out from photodiode PDA by first pulsing signal RST, then sampling the reset level, pulsing signal TXA and TXB simultaneously, and then sampling the transferred signal level. The time period from the initial reset pulse to TXA pulsing high during readout is the integration time Tint_A of photodiode PDA.

To place pixel 800 in low conversion gain mode, signal DCG may be asserted throughout the readout period (as indicated by waveform 810). To place pixel 800 in high conversion gain mode, signal DCG may only be pulsed high when signal RST is pulsed high during Treadout (as indicated by dotted waveform 812). This type of sequential readout scheme where an image signal is computed by taking the difference between the sampled reset signal and the sampled transferred signal is sometimes referred to as correlated double sampling (CDS). If desired, other types of readout schemes may also be used.

Figure 9A:
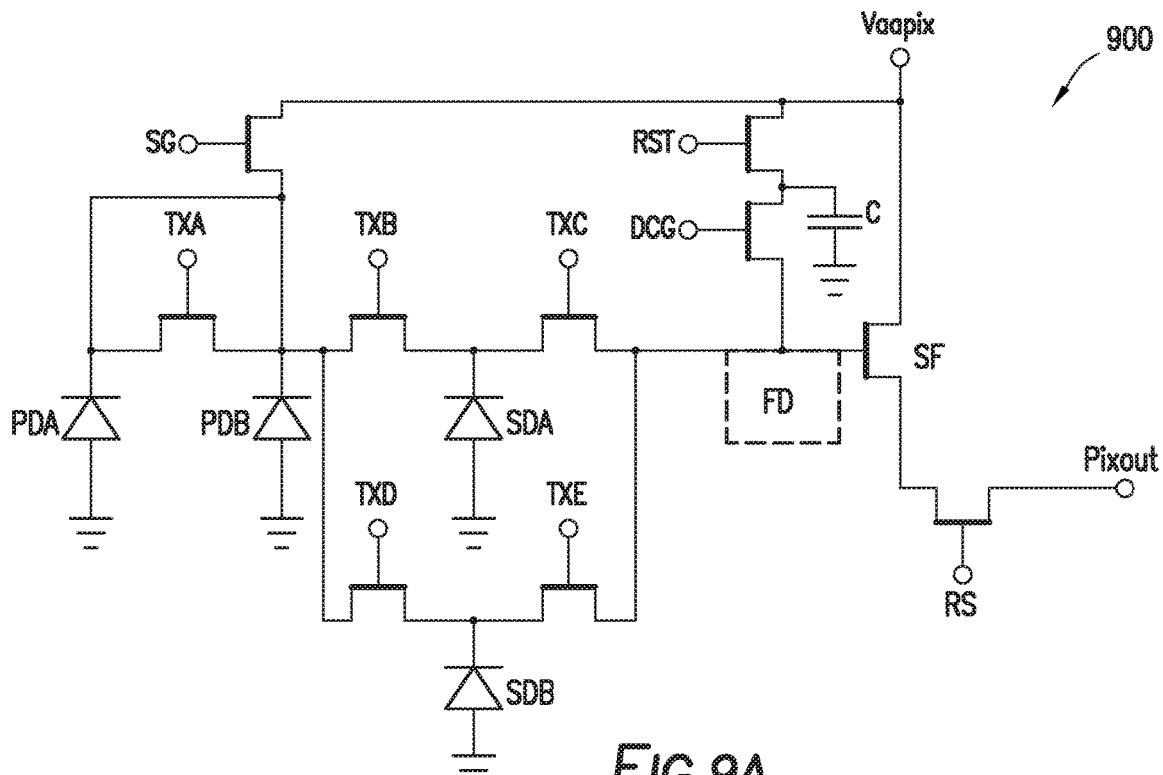
FIG. 9A is a circuit diagram of a dual conversion gain image sensor pixel with parallel storage nodes that is operable using a global shutter scheme in accordance with an embodiment.

FIG. 9A is a circuit diagram of a dual conversion gain image sensor pixel such as pixel 900 that has parallel storage nodes and that is operable using a global shutter scheme. Compared to pixel 800 of FIG. 8A, pixel 900 may also include at least two stacked photodiodes PDA and PDB and associated vertical charge transfer structures (controlled by signals SG, TXA, TXB, and TXD). In particular, the transistor controlled by signal SG may be shorted to both photodiode PDA and PDB. Pixel 900 may also include two parallel storage diodes SDA and SDB, which can be formed via either epitaxy or implantation. Storage node SDA may serve to store charge accumulated in photodiode PDA, whereas storage node SDB may serve to store charge accumulated in photodiode PDB. If the storage diodes are formed using epitaxial layers (as in the arrangement of FIG. 2), then the transfer gates controlled by signals TXC and TXE may also be vertical (deep trench) transfer gates. If, however, the storage diodes are formed using implantation, then the transfer gates controlled by signals TXC and TXE may also be implemented using horizontal transfer gates.

Photodiode PDA may have a first pinning potential level, photodiode PDB may have a second pinning potential level that is higher than the first pinning potential, storage diodes SDA and SDB may have a third pinning potential that is higher than the second pinning potential, and the floating diffusion region may have a fourth potential level that is even higher than the third pinning potential. Signal TXA may be asserted to transfer charge from PDA to PDB. Signal TXB may be asserted to transfer charge from PDB to SDA. Signal TXD may be asserted to transfer charge from PDB to SDB. Signal TXC may be asserted to transfer charge from SDA to FD. Signal TXE may be asserted to transfer charge from SDB to FD.

Figure 9B:
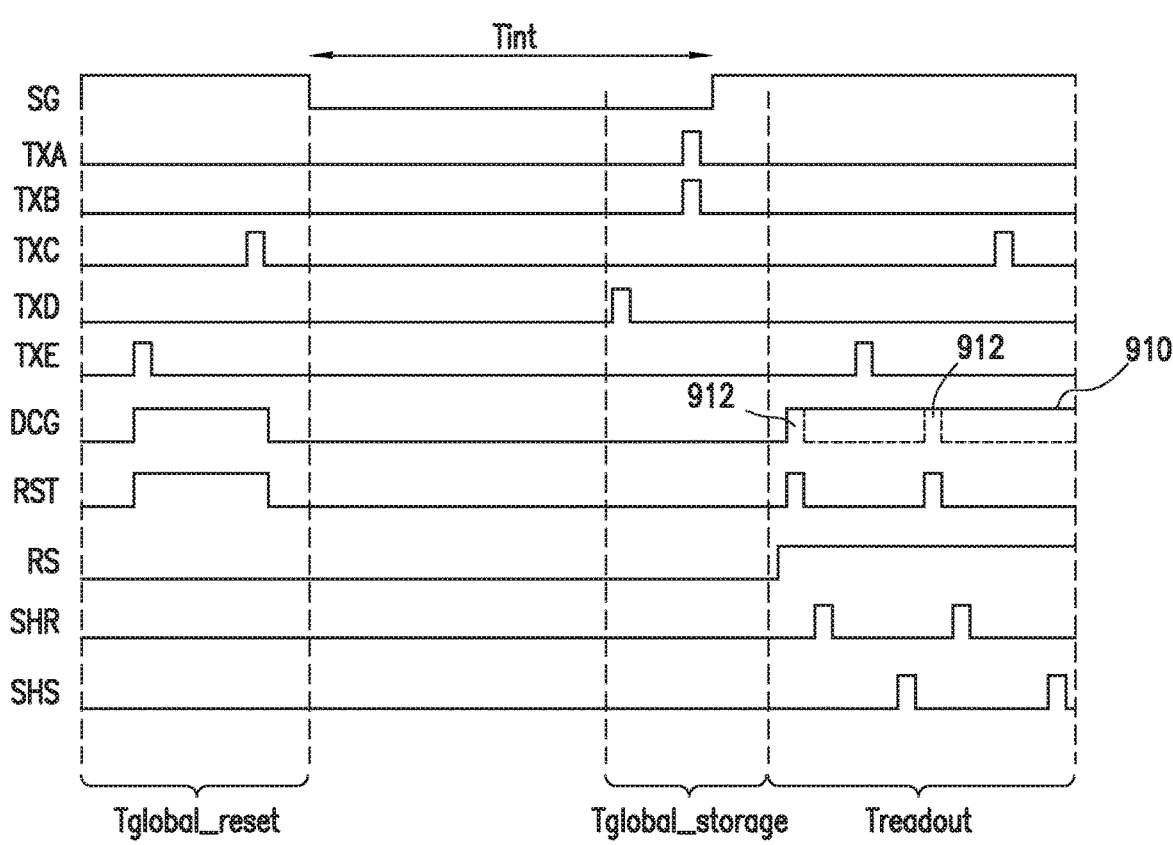
FIG. 9B is a timing diagram showing the behavior of relevant waveforms associated with operating the image sensor pixel of FIG. 9A in accordance with an embodiment.

FIG. 9B is a timing diagram showing the behavior of relevant waveforms associated with operating the image sensor pixel of FIG. 9A using a global shutter scheme. During a global reset period Tglobal_reset, signals RST and DCG may be asserted, while signals TXE and TXC can be sequentially pulsed high to reset storage diodes SDA and SDB, respectively. Signal SG may be asserted during the entirety of Tglobal_reset to also reset photodiodes PDA and PDB. After reset, photodiodes PDA and PDB are allowed to integrate and accumulate charge.

During a global storage period Tglobal_storage, control signal TXD may be pulsed high to transfer charge from PDB to SDB, and then control signals TXA and TXB can be simultaneously pulsed high to transfer charge from PDA to SDA via PDB. The time period from the deassertion of signal SG to TXA/TXB pulsing high during Tglobal_storage represents the global integration time Tint.

During readout period Treadout, row select signal RS may be asserted. Charge may first be read out from photodiode PDB by first pulsing signal RST, then sampling the reset level (by pulsing SHR), pulsing signal TXE to transfer charge from SDB to FD, and then sampling the transferred signal level (by pulsing SHS). Charge can then be read out from photodiode PDA by first pulsing signal RST, then sampling the reset level, pulsing signal TXC to transfer charge from SDA to FD, and then sampling the transferred signal level.

To place pixel 900 in low conversion gain mode, signal DCG may be asserted throughout the readout period (as indicated by waveform 910). To place pixel 900 in high conversion gain mode, signal DCG may only be pulsed high when signal RST is pulsed high during Treadout (as indicated by dotted waveform 912). This type of readout scheme where an image signal is computed by taking the difference between the sampled reset signal and the sampled transferred signal is sometimes referred to as correlated double sampling (CDS). If desired, other types of readout schemes may also be used.

Figure 10A:
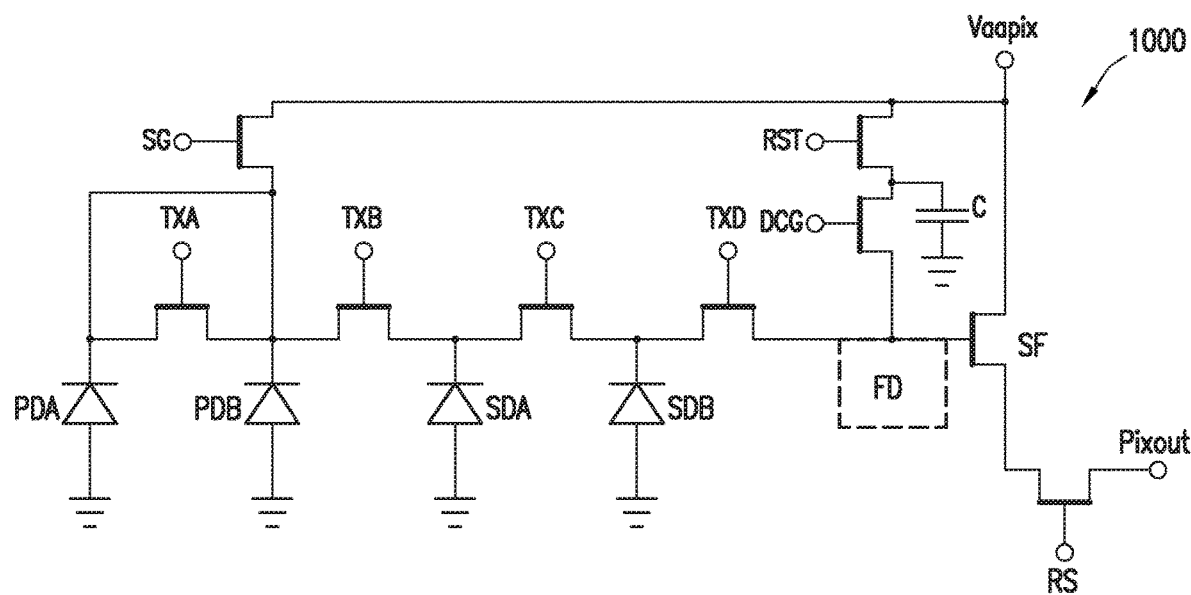
FIG. 10A is a circuit diagram of a dual conversion gain image sensor pixel with serial storage nodes that is operable using a global shutter scheme in accordance with an embodiment.

FIG. 10A is a circuit diagram of a dual conversion gain image sensor pixel such as pixel 1000 that has serial storage nodes and that is operable using a global shutter configuration. Compared to pixel 900 of FIG. 9A, pixel 1000 may also include at least two stacked photodiodes PDA and PDB and associated vertical charge transfer structures (controlled by signals SG, TXA, and TXB). In particular, the transistor controlled by signal SG may be shorted to both photodiode PDA and PDB.

Pixel 1000 may also include two serial storage diodes SDA and SDB, which can be formed via either epitaxy or implantation. Storage node SDA may serve to store charge accumulated in photodiode PDA, whereas storage node SDB may serve to store charge accumulated in photodiode PDB. If the storage diodes are formed using epitaxial layers (as in the arrangement of FIG. 2), then the transfer gates controlled by signals TXC and TXD may also be vertical (deep trench) transfer gates. If, however, the storage diodes are formed using implantation, then the transfer gates controlled by signals TXC and TXD may also be implemented using horizontal transfer gates. Pixel 1000 may use fewer transfer gates than pixel 900.

Photodiode PDA may have a first pinning potential level, photodiode PDB may have a second pinning potential level that is higher than the first pinning potential, storage diode SDA may have a third pinning potential level that is higher than the second pinning potential, storage diode SDB may have a fourth pinning potential level that is higher than the third pinning potential, and the floating diffusion region may have a fifth potential level that is even higher than the fourth pinning potential. Signal TXA may be asserted to transfer charge from PDA to PDB. Signal TXB may be asserted to transfer charge from PDB to SDA. Signal TXC may be asserted to transfer charge from SDA to SDB. Signal TXD may be asserted to transfer charge from SDB to FD.

Figure 10B:
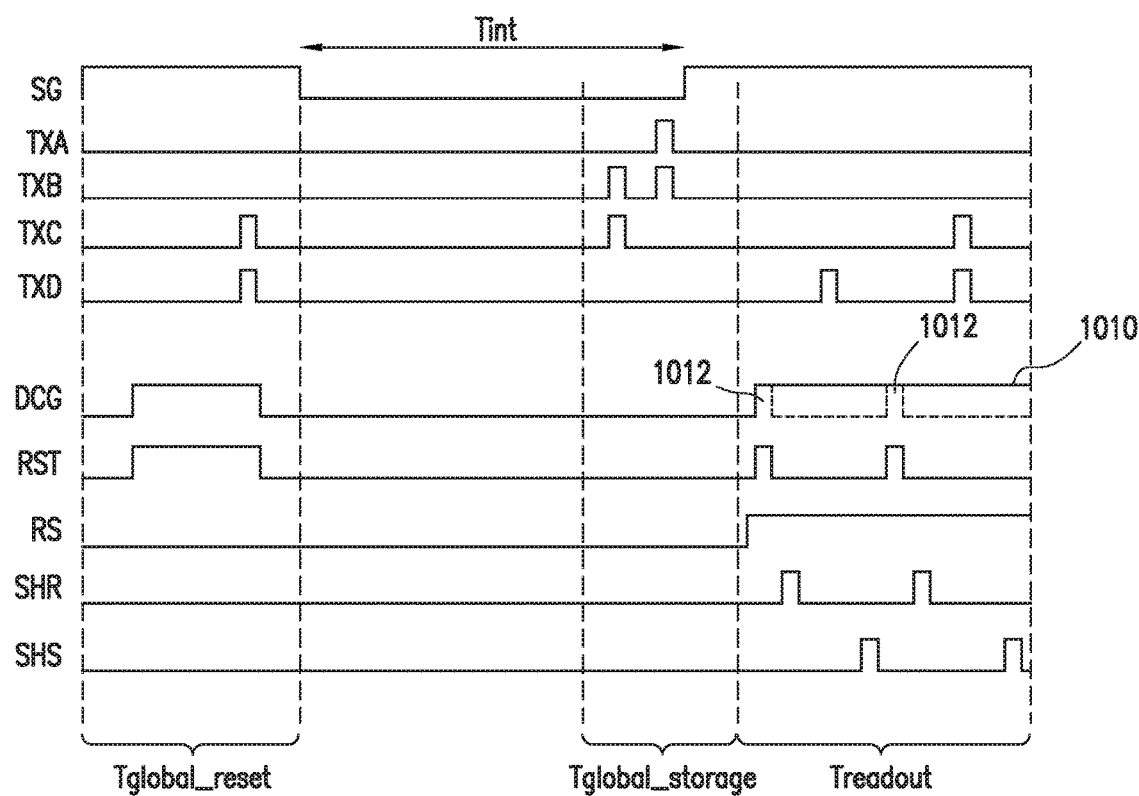
FIG. 10B is a timing diagram showing the behavior of relevant waveforms associated with operating the image sensor pixel of FIG. 10A in accordance with an embodiment.

FIG. 10B is a timing diagram showing the behavior of relevant waveforms associated with operating image sensor pixel 1000 using a global shutter configuration. During a global reset period Tglobal_reset, signals RST and DCG may be asserted, while signals TXC and TXD are simultaneously pulsed high to reset storage diodes SDA and SDB. Signal SG may be asserted during the entirety of Tglobal_reset to also reset photodiodes PDA and PDB. After reset, photodiodes PDA and PDB are allowed to integrate and accumulate charge.

During a global storage period Tglobal_storage, control signals TXB and TXC may be simultaneously pulsed high to transfer charge from PDB to SDB, and then control signals TXA and TXB can be simultaneously pulsed high to transfer charge from PDA to SDA via PDB. The time period from the deassertion of signal SG to TXA/TXB pulsing high during Tglobal_storage represents the global integration time Tint.

During readout period Treadout, row select signal RS may be asserted. Charge may first be read out from photodiode PDB by first pulsing signal RST, then sampling the reset level (by pulsing SHR), pulsing signal TXD to transfer charge from SDB to FD, and then sampling the transferred signal level (by pulsing SHS). Charge can then be read out from photodiode PDA by first pulsing signal RST, then sampling the reset level, pulsing signals TXC and TXD simultaneously to transfer charge from SDA to FD, and then sampling the transferred signal level.

To place pixel 1000 in low conversion gain mode, signal DCG may be asserted throughout the readout period (as indicated by waveform 1010). To place pixel 1000 in high conversion gain mode, signal DCG may only be pulsed high when signal RST is pulsed high during Treadout (as indicated by dotted waveform 1012). This type of readout scheme where an image signal is computed by taking the difference between the sampled reset signal and the sampled transferred signal is sometimes referred to as correlated double sampling (CDS). If desired, other types of readout schemes may also be used.

The examples above described and shown in connection with FIGS. 2-10 in which each pixel circuit includes at least two vertically stacked photodiodes is merely illustrative and do not serve to limit the scope of the present embodiments. If desired, each pixel circuit may include three or more vertically stacked photodiodes, and any suitable number of vertical (deep trench) transfer gates having the same or different depths, any number of floating diffusion regions, any number of storage/memory diode regions, and any type of associated pixel readout circuits for operating the pixel in either a rolling shutter configuration or a global shutter configuration. The techniques described above may be implemented on either a backside illumination image sensor or a front-side illumination image sensor.

The foregoing is merely illustrative of the principles of this invention and various modifications can be made by those skilled in the art. The foregoing embodiments may be implemented individually or in any combination.

What is claimed is:

1. An image sensor comprising:
    a first layer of a first doping type;
    a second layer of a second doping type different from the first doping type, the second layer formed adjacent to the first layer;
    a third layer of the first doping type, the third layer formed adjacent to the second layer;
    a floating diffusion region of the first doping type; and
    a transfer gate comprising conductive gate material and a region of the second doping type around the conductive gate material, wherein the region of the second doping type is in contact with the first layer, the third layer, and the floating diffusion region.

2. The image sensor defined in claim 1, wherein the transfer gate is a vertical transfer gate.

3. The image sensor defined in claim 1, wherein the transfer gate comprises a dielectric gate liner interposed between the conductive gate material and the region of the second doping type.

4. The image sensor defined in claim 1, wherein the first layer is an epitaxial layer of the first doping type.

5. The image sensor defined in claim 4, wherein the second layer is an epitaxial layer of the second doping type.

6. The image sensor defined in claim 1, further comprising:
    a fourth layer of the second doping type, wherein the fourth layer is formed adjacent to the third layer and is selected from the group consisting of an epitaxial layer and a well implant.

7. The image sensor defined in claim 1, wherein the conductive gate material extends vertically between a front surface of the image sensor and a back surface of the image sensor.

8. The image sensor defined in claim 7, wherein the conductive gate material is the only conductive gate material in the transfer gate.

9. The image sensor defined in claim 1, wherein the transfer gate selectively transfers charge from the first layer and the third layer to the floating diffusion region.

10. An image sensor having a front surface and a back surface, the image sensor comprising:
    a first layer of a first doping type, wherein the first layer forms the front surface;
    a second layer of a second doping type different from the first doping type, wherein the second layer is interposed between the first layer and the back surface;
    a first vertical transfer gate that selectively transfers charge from the second layer towards the front surface, wherein the first vertical transfer gate has a first depth; and
    a second vertical transfer gate that selectively transfers charge from the second layer towards the front surface, wherein the second vertical transfer gate has a second depth that is different than the first depth.

11. The image sensor defined in claim 10, further comprising:
- a first floating diffusion region, wherein the first vertical transfer gate selectively transfers charge from the second layer to the first floating diffusion region; and
- a second floating diffusion region, wherein the second vertical transfer gate selectively transfers charge from the second layer to the second floating diffusion region.

12. The image sensor defined in claim 11, further comprising:
- a third layer of the first doping type, wherein the third layer is interposed between the second layer and the back surface; and
- a fourth layer of the second doping type, wherein the fourth layer is interposed between the third layer and the back surface.

13. The image sensor defined in claim 12, wherein the first vertical transfer gate selectively transfers charge from the second layer and the fourth layer to the first floating diffusion region and wherein the second vertical transfer gate selectively transfers charge from only the second layer to the second floating diffusion region.

14. The image sensor defined in claim 13, wherein the first depth is greater than the second depth.

15. The image sensor defined in claim 14, wherein the first vertical transfer gate comprises first conductive gate material, a first region of the first doping type, and a first dielectric gate liner interposed between the first conductive gate material and the first region of the first doping type, wherein the first region of the first doping type is in contact with the first floating diffusion region, the second layer, and the fourth layer.

16. The image sensor defined in claim 15, wherein the second vertical transfer gate comprises second conductive gate material, a second region of the first doping type, and a second dielectric gate liner interposed between the second conductive gate material and the second region of the first doping type, wherein the second region of the first doping type is in contact with the second floating diffusion region and the second layer, and wherein the image sensor further comprises:
- a fifth layer of the first doping type, wherein the fifth layer is interposed between the fourth layer and the back surface;
- a sixth layer of the second doping type, wherein the sixth layer is interposed between the fifth layer and the back surface; and
- a residual substrate adjacent to the sixth layer that forms the back surface; and
- a third vertical transfer gate that selectively transfers charge from the second, fourth, and sixth layers towards the front surface, wherein the third vertical transfer gate has a third depth that is greater than the first depth.

17. The image sensor defined in claim 10, further comprising:
- a first floating diffusion region;
- a third layer of the first doping type, wherein the third layer is interposed between the second layer and the back surface; and
- a fourth layer of the second doping type, wherein the fourth layer is interposed between the third layer and the back surface and wherein the first vertical transfer gate selectively transfers charge from the second layer and the fourth layer to the first floating diffusion region.

18. An image sensor comprising:
- a first layer of a first doping type, wherein the first layer has first and second opposing surfaces;
- a second layer of a second doping type different from the first doping type, wherein the second layer is formed adjacent to the first layer;
- a first transfer gate that extends away from the first layer along a first length orthogonal to the first surface, wherein the first transfer gate selectively transfers charge from the second layer towards the first surface; and
- a second transfer gate that extends away from the first layer along a second length orthogonal to the first surface, wherein the second transfer gate second selectively transfers charge from the second layer towards the first surface, and wherein the second length is greater than the first length.

19. The image sensor defined in claim 18, further comprising:
- a third layer of the first doping type, wherein the third layer is adjacent to the second layer; and
- a fourth layer of the second doping type, wherein the fourth layer is adjacent to the third layer, wherein the third layer is interposed between the second and fourth layers.

20. The image sensor defined in claim 19, wherein the first transfer gate extends away from the first layer along the first length to the second layer without reaching the fourth layer and wherein the second transfer gate extends away from the first layer along the second length to the fourth layer.

* * * * *